US011448699B2

(12) United States Patent
Koga

(10) Patent No.: US 11,448,699 B2
(45) Date of Patent: Sep. 20, 2022

(54) INPUT DEVICE, AND INPUT DIAGNOSING METHOD

(71) Applicant: Mitsubishi Electric Corporation, Tokyo (JP)

(72) Inventor: Hiroki Koga, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/609,788

(22) PCT Filed: Jul. 22, 2020

(86) PCT No.: PCT/JP2020/028473
§ 371 (c)(1),
(2) Date: Nov. 9, 2021

(87) PCT Pub. No.: WO2021/015244
PCT Pub. Date: Jan. 28, 2021

(65) Prior Publication Data
US 2022/0146577 A1 May 12, 2022

(30) Foreign Application Priority Data
Jul. 23, 2019 (WO) .................. PCT/JP2019/028810

(51) Int. Cl.
G01R 31/327 (2006.01)
(52) U.S. Cl.
CPC .............. G01R 31/3278 (2013.01)
(58) Field of Classification Search
CPC .................................. G01N 31/3278
See application file for complete search history.

(56) References Cited

U.S. PATENT DOCUMENTS 3,950,656 A 4/1976 Sumida et al.
4,525,699 A 6/1985 Buck et al.
(Continued)

FOREIGN PATENT DOCUMENTS

DE 102006054877 A1 5/2008
EP 2960922 A1 * 12/2015 .............. B61L 3/121
(Continued)

OTHER PUBLICATIONS

International Search Report and Written Opinion dated Oct. 6, 2020, received for PCT Application PCT/JP2020/028473, Filed on Jul. 22, 2020, 11 pages including English Translation.
(Continued)

Primary Examiner — Jeff W Natalini
(74) Attorney, Agent, or Firm — Xsensus LLP

(57) ABSTRACT

An input device (10) is connectable to a switch (20) to receive a state of the switch (20) input as a voltage corresponding to the state. The input device (10) includes an output circuit (120) to output a first voltage or a second voltage different from the first voltage, an input circuit (150) to receive the voltage input from the output circuit (120) via the switch (20) in a closed state and output input signals (33) corresponding to the input voltage, a diagnoser (112) to determine whether the input signals change in response to switching of the voltage from the output circuit (120) to the second voltage, and a generator (113) to generate a state signal (34) indicating the state of the switch (20) based on the input signals (33). The second voltage differs from a reference voltage input to the input circuit (150) while the switch (20) is open.

2 Claims, 26 Drawing Sheets

(56) References Cited

U.S. PATENT DOCUMENTS

| | | | |
|---|---|---|---|
| 2011/0178612 A1 | 7/2011 | Nakatani et al. | |
| 2016/0131713 A1* | 5/2016 | Edwards | G01R 19/16566 324/415 |
| 2016/0223615 A1* | 8/2016 | Nishi | H01H 47/002 |
| 2017/0120754 A1* | 5/2017 | Yoon | G01R 31/3278 |
| 2018/0113170 A1* | 4/2018 | Liu | G01R 31/327 |
| 2019/0353708 A1* | 11/2019 | Kim | G01R 31/3278 |

FOREIGN PATENT DOCUMENTS

| | | | |
|---|---|---|---|
| JP | 50-46374 A | 4/1975 | |
| JP | 50-76567 A | 6/1975 | |
| JP | 58-194428 A | 11/1983 | |
| JP | 64-10533 A | 1/1989 | |
| JP | 5-232176 A | 9/1993 | |
| JP | 11-237427 A | 8/1999 | |
| JP | 2010-140803 A | 6/2010 | |
| JP | 2011-145988 A | 7/2011 | |
| JP | 2013-32946 A | 2/2013 | |

OTHER PUBLICATIONS

International Search Report and Written Opinion dated Oct. 8, 2019, received for PCT Application PCT/JP2019/028810, Filed on Jul. 23, 2019, 9 pages including English Translation.
Notice of Reasons for Refusal dated Feb. 2, 2021, received for JP Application 2020-563571, 6 pages including English Translation.
Decision to Grant dated Jun. 1, 2021, received for JP Application 2020-563571, 5 pages including English Translation.

\* cited by examiner

FIG.4

| FIRST CONTROL SIGNAL | SECOND CONTROL SIGNAL | OUTPUT VOLTAGE |
|---|---|---|
| ON | OFF | FIRST VOLTAGE |
| OFF | ON | SECOND VOLTAGE |
| OFF | OFF | REFERENCE VOLTAGE (GROUND) |

FIG.7

| INPUT VOLTAGE Vi | FIRST INPUT SIGNAL | SECOND INPUT SIGNAL | STATE SIGNAL |
|---|---|---|---|
| $Vt1 < Vi$ | H | H | 1 |
| $Vt2 < Vi < Vt1$ | L | H | 0 |
| $Vi < Vt2$ | L | L | 1 |

FIG.23

| INPUT VOLTAGE Vi | FIRST INPUT SIGNAL | SECOND INPUT SIGNAL | STATE SIGNAL |
|---|---|---|---|
| Vt1 < Vi | H | H | 1 |
| Vt2 < Vi < Vt1 | L | H | 1 |
| Vi < Vt2 | L | L | 0 |

INPUT DEVICE, AND INPUT DIAGNOSING METHOD

CROSS-REFERENCE TO RELATED APPLICATIONS

The present application is based on PCT filing PCT/JP2020/028473, filed Jul. 22, 2020, which claims priority to JP PCT/JP2019/028810, filed Jul. 23, 2019, the entire contents of each are incorporated herein by reference.

TECHNICAL FIELD

The present disclosure relates to an input device and a method of diagnosing input.

BACKGROUND ART

Devices applied in the field of factory automation (FA) are required to have a safety performance in general. For example, an input device of a certain type, which is connected to an external switch via wires and receives a signal indicating the state of the switch, needs to confirm that the conduction state of the wire is normal even when the state of the switch is not expected to be changed by an external force. Some techniques for self-diagnosis at such an input device have been proposed (for example, refer to Patent Literature 1).

Patent Literature 1 discloses a safety input device that outputs a pulse train signal as self-diagnosis pattern data and receives this pulse train signal via a controlled object. The safety input device executes a self-diagnosis process by determining whether any difference exists between the output self-diagnosis pattern data and self-diagnosis pattern data obtained by decrypting the received signal.

CITATION LIST

Patent Literature

Patent Literature 1: Unexamined Japanese Patent Application Publication No. 2011-145988

SUMMARY OF INVENTION

Technical Problem

The safety input device disclosed in Patent Literature 1 removes the pulse train signal to be used in self-diagnosis from the received signal through filtering at a low-pass filter and thereby acquires a signal for normal control. The use of such a signal for control obtained by filtering at the low-pass filter may lead to failure in rapid response to the input signal. This problem requires a solution to improve the input responsiveness of an input device in parallel to execution of self-diagnosis.

An objective of the present disclosure is to improve the input responsiveness of an input device in parallel to execution of self-diagnosis.

Solution to Problem

In order to achieve the above objective, an input device according to an aspect of the present disclosure is connectable to a switch to receive a state of the switch, which is input in the form of a voltage corresponding to the state. The input device includes: output means for outputting a voltage selected from a first voltage and a second voltage different from the first voltage; input means for receiving the voltage output from the output means via the switch in a closed state and outputting an input signal corresponding to the input voltage; diagnosis means for determining whether any change occurs in the input signal in response to switching of the voltage output from the output means to the second voltage; and generation means for generating a state signal indicating the state of the switch on the basis of the input signal. The second voltage differs from a reference voltage input to the input means while the switch is in an open state.

Advantageous Effects of Invention

According to an aspect of the present disclosure, the diagnosis means determines whether any change occurs in the input signal in response to switching of the voltage output from the output means to the second voltage. The diagnosis means thereby confirms whether the conduction state of the path between the input device and the switch is normal. Furthermore, the generation means generates the state signal indicating the state of the switch on the basis of the input signal corresponding to the input voltage. Since the input voltage is equal to the voltage selected from the first voltage and the second voltage while the switch is in the closed state, the generation means can generate the state signal directly from the input signal corresponding to the input voltage. This configuration can improve the input responsiveness of the input device in parallel to execution of self-diagnosis.

BRIEF DESCRIPTION OF DRAWINGS

FIG. 4 illustrates a correspondence relationship between control signals and an output voltage according to Embodiment 1;

FIG. 7 illustrates a correspondence relationship between an input voltage, input signals, and a state signal according to Embodiment 1;

FIG. 23 illustrates a correspondence relationship between an input voltage, input signals, and a state signal according to Embodiment 2;

DESCRIPTION OF EMBODIMENTS

An input device 10 according to an embodiment of the present disclosure is described in detail below with reference to the accompanying drawings.

Embodiment 1

Figure 1:
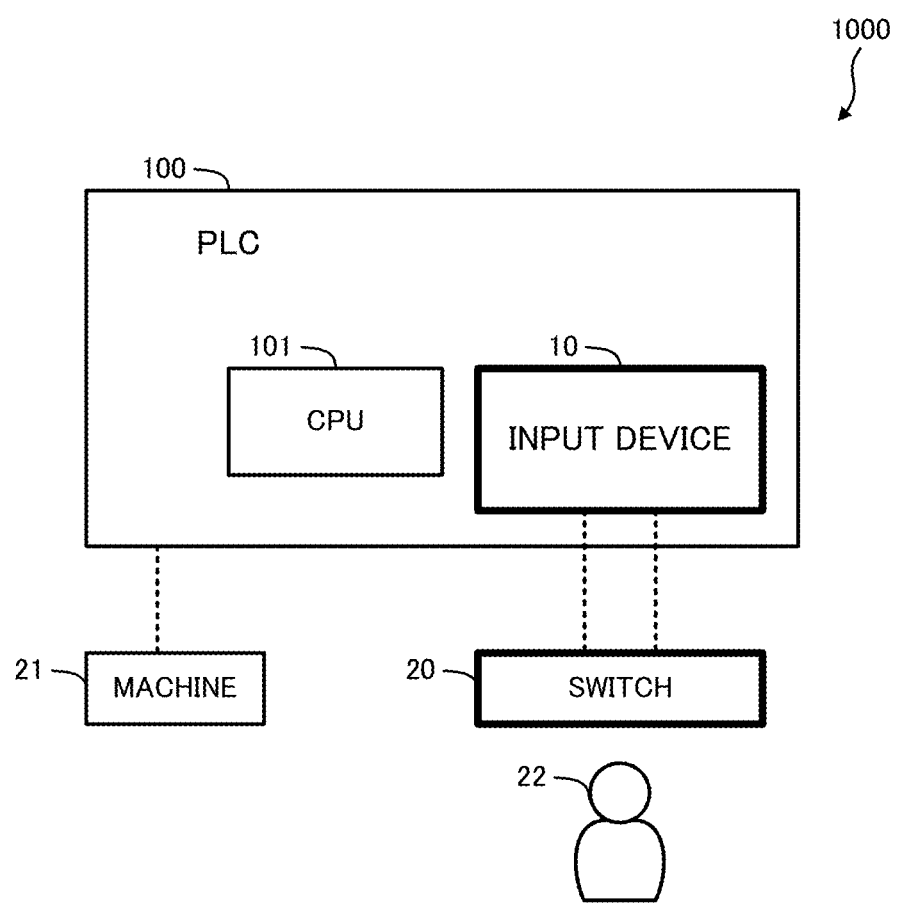
FIG. 1 illustrates a configuration of a control system according to Embodiment 1.

FIG. 1 illustrates a configuration of a programmable logic controller (PLC) 100 including the input device 10 according to the embodiment. The PLC 100 constitutes a control system 1000 established in a factory, together with a switch 20 and a machine 21. The PLC 100 and the machine 21 are connected to each other via a dedicated line or industrial network and communicate with each other. The input device 10 of the PLC 100 is connected to the switch 20 via two wires.

The PLC 100 is a control device to control the machine 21 installed on a production line, and operates the production line depending on the state of the switch 20. For example, the PLC 100 stops the production line in the case where a user 22 pushes the switch 20 serving as an emergency stop button, and operates the production line in the other cases. The PLC 100 includes a central processing unit (CPU) 101 to execute arithmetic operations and the input device 10 to serve as an input unit of the PLC 100.

Figure 2:
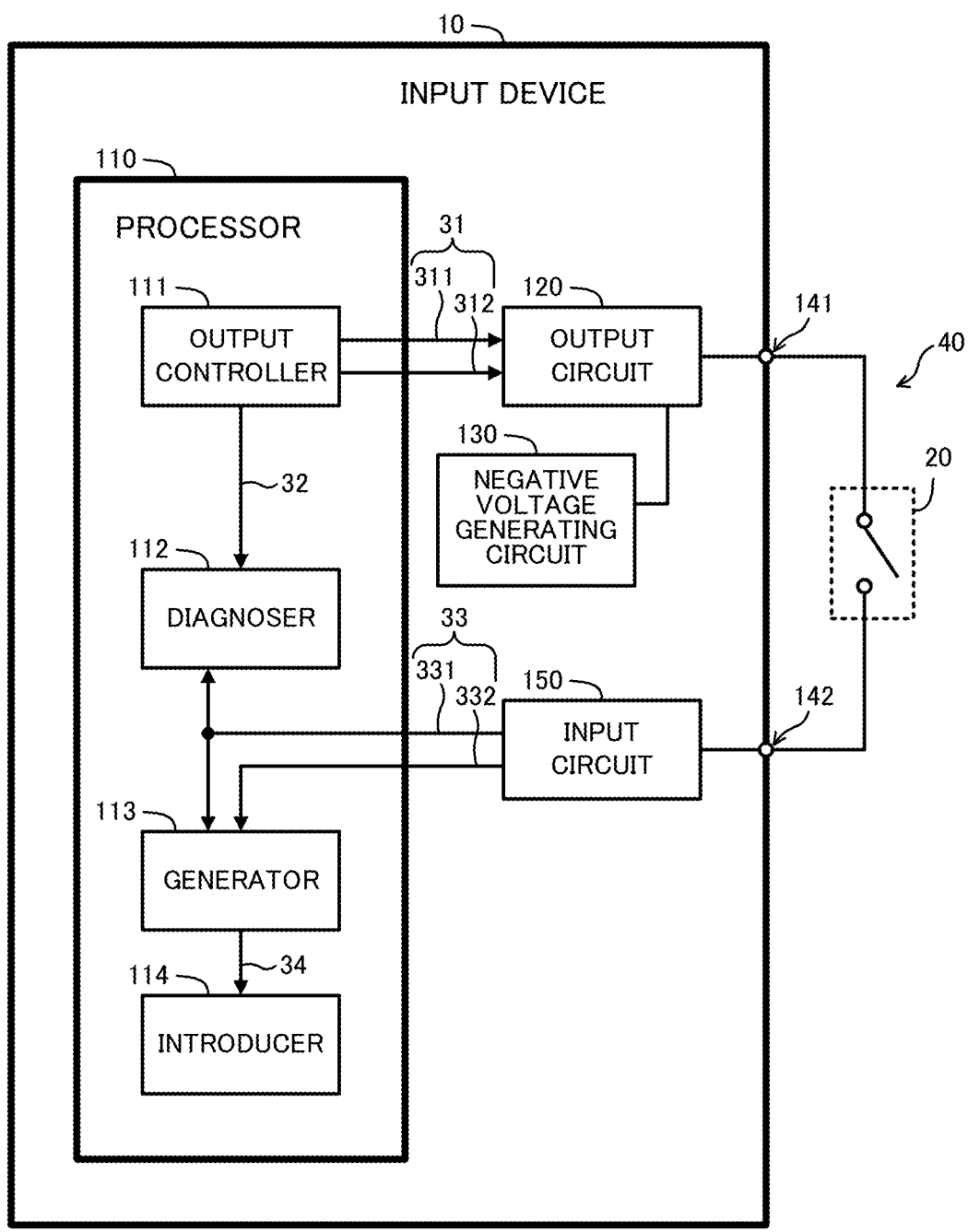
FIG. 2 illustrates a configuration of an input device according to Embodiment 1.

The input device 10 receives the state of the switch 20, which is input in the form of a voltage corresponding to this state. As illustrated in FIG. 2, the input device 10 includes a processor 110 to execute various arithmetic operations and thus perform the functions described below, an output circuit 120 to output an output voltage under instructions from the processor 110, a negative voltage generating circuit 130 to generate a negative voltage to be used at the output circuit 120, an output terminal 141 and an input terminal 142 electrically connected to the switch 20 via wires, and an input circuit 150 to which the output voltage from the output circuit 120 is input via the switch 20.

The processor 110 is, for example, a micro processing unit (MPU), or a large-scale integration (LSI) integrated with a random access memory (RAM) in the form of a system-on-a-chip (SoC). The processor 110 may have another hardware configuration, such as a field programmable gate array (FPGA), an application specific integrated circuit (ASIC), or other IC component. The processor 110 has functional configurations including an output controller 111 to control the output of voltage from the output circuit 120, a diagnoser 112 to diagnose the conduction state of the wires from the output circuit 120 via the switch 20 to the input circuit 150 on the basis of input signals 33 generated at the input circuit 150, a generator 113 to generate a state signal 34 indicating the open or closed state of the switch 20 from the input signals 33, and an introducer 114 to introduce the state signal 34 to the CPU 101.

The output controller 111 transmits control signals 31 to the output circuit 120 and thereby causes the output circuit 120 to output a voltage corresponding to the control signals 31. The control signals 31 contain a first control signal 311 and a second control signal 312. Each of the first control signal 311 and the second control signal 312 is a 1-bit signal indicating either one of the on and off states depending on whether self-diagnosis is being executed. In detail, the first control signal 311 is a current signal having a current value indicating the on state while no diagnosis is being executed, and having a current value indicating the off state while diagnosis is being executed. The second control signal 312 is a current signal having a current value indicating the on state while diagnosis is being executed, and having a current value indicating the off state while no diagnosis is being executed. One of the current values corresponding to the respective states may be 0. The first control signal 311 and the second control signal 312 may be not current signals but voltage signals having voltage values corresponding to whether diagnosis is being executed. For example, the current value of the first control signal 311 indicating the on state is 10 µA, and the current value indicating the off state is 0 A. For example, the current value of the second control signal 312 indicating the on state is 10 µA, and the current value indicating the off state is 0 A.

During a normal period in which the production line is running without execution of diagnosis, the output controller 111 outputs the control signals 31 containing the first control signal 311 and the second control signal 312 that correspond to the situation of no execution of diagnosis, and causes the output circuit 120 to output, for example, an output voltage of 24 V as a first voltage. In contrast, during a diagnostic period in which the production line is running in parallel to execution of diagnosis, the output controller 111 outputs the control signals 31 containing the first control signal 311 and the second control signal 312 that correspond to the situation of execution of diagnosis, and causes the output circuit 120 to output a negative output voltage as a second voltage. The negative output voltage is −12 V, for example. The output controller 111 also transmits a period signal 32 indicating whether the current time is within a diagnostic period to the diagnoser 112.

The diagnoser 112 receives the period signal 32 from the output controller 111, and receives the first input signal 331 of the input signals 33 generated at the input circuit 150 from the input circuit 150. When the current time reaches a time within a diagnostic period, the diagnoser 112 determines whether any change occurs in the first input signal 331, and thereby diagnoses whether the conduction state of a path 40 from the output circuit 120 via the switch 20 to the input circuit 150 is normal. In detail, when any change occurs in the first input signal 331, the diagnoser 112 diagnoses the conduction state to be normal. In contrast, when no change occurs in the first input signal 331, the diagnoser 112 determines that the value of the voltage signal input to the input circuit 150 is stuck and diagnoses the conduction state to be abnormal. In the case where the diagnosis at the diagnoser 112 finds abnormality, the processor 110 may notify the CPU 101 of the found abnormality or execute another process. In the case where the diagnosis at the diagnoser 112 finds no abnormality, the processor 110 may notify the CPU 101 of the normal conduction state, or wait for the subsequent diagnosis without executing a process that is based on the result of the current diagnosis. The diagnoser 112 corresponds to an example of diagnosis means in the input device 10 for determining whether any change occurs in the input signal in response to switching of the voltage output from the output circuit 120 serving as output means to the second voltage.

The generator 113 receives the input signals 33 generated at the input circuit 150. The input signals 33 contain the first input signal 331 and the second input signal 332. Each of the first input signal 331 and the second input signal 332 is a 1-bit signal having either one of the high and low voltage levels corresponding to the voltage values of the input voltage. In detail, the first input signal 331 is a voltage signal having a high-level voltage value when the input voltage is higher than a first threshold voltage, and having a low-level voltage value when the input voltage is lower than the first threshold voltage. The second input signal 332 is a voltage signal having a high-level voltage value when the input voltage is higher than a second threshold voltage, and having a low-level voltage value when the input voltage is lower than the second threshold voltage. One of the voltage values corresponding to the respective states may be 0 V equal to the ground electric potential. The first input signal 331 and the second input signal 332 may be not voltage signals but current signals having current values corresponding to the input voltage. For example, the high-level voltage value of the first input signal 331 is 5 V, and the low-level voltage value is 0 V. For example, the high-level voltage value of the second input signal 332 is 5 V, and the low-level voltage value is 0 V.

The generator 113 generates the state signal 34 indicating the open or closed state of the switch 20 from the input signals 33 by logical operation and transmits the generated state signal 34 to the introducer 114. The input signals 33 correspond to the input voltage, and therefore indicate whether the switch 20 is in the open or closed state, and also indicate whether the input voltage is equal to the first voltage or the second voltage when the switch 20 is in the closed state. The state signal 34 differs from the input signals 33 in that the input signals 33 indicate additional information other than the open or closed state of the switch while the state signal 34 directly indicates the open or closed state of the switch and does not indicate other information. The generator 113 corresponds to an example of generation means in the input device 10 for generating a state signal indicating the state of the switch on the basis of the input signal.

The introducer 114 receives the state signal 34 from the generator 113 and outputs an introduction signal to the outside depending on the value of the state signal 34. For example, the introducer 114 may notify the CPU 101 of the original value of the state signal 34 or a value obtained by modifying the state signal 34.

Figure 3:
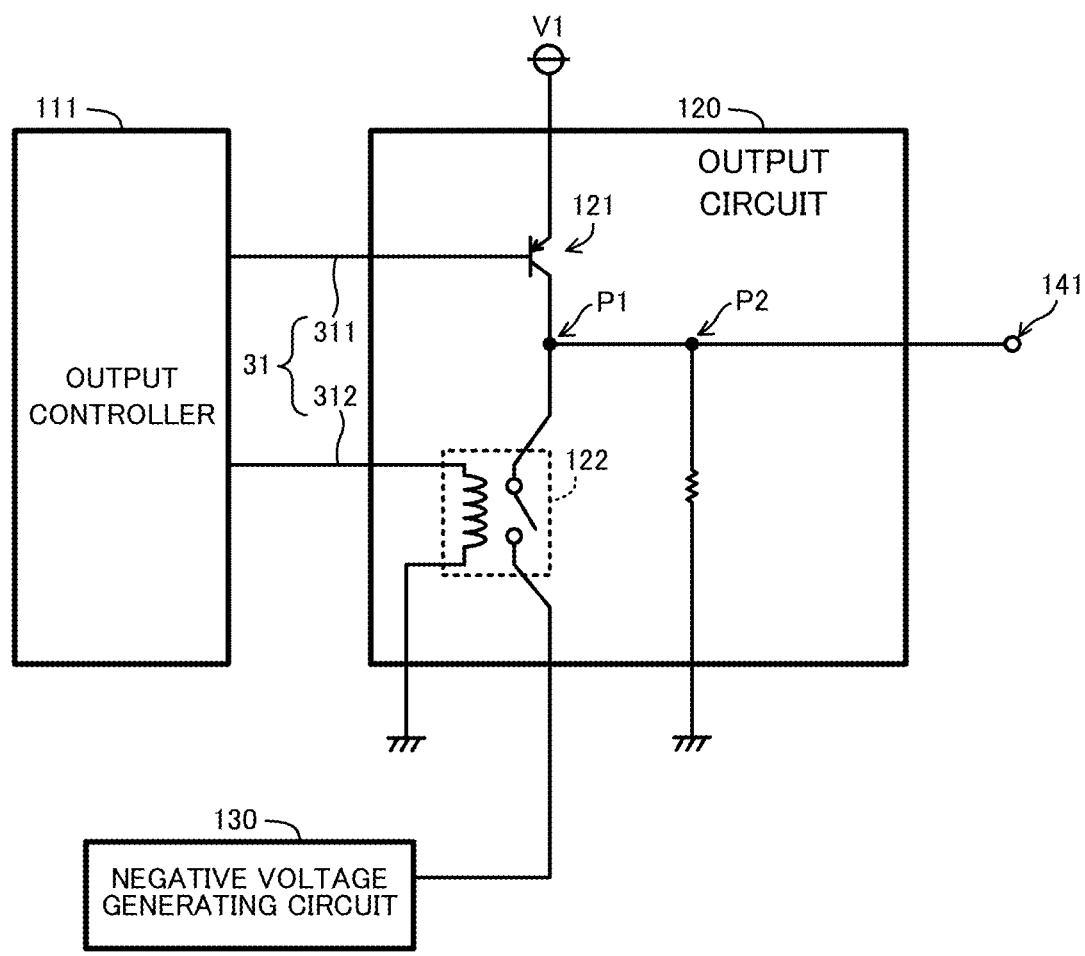
FIG. 3 illustrates a configuration of an output circuit according to Embodiment 1.

The output circuit 120 outputs an output voltage selected from the first voltage and the second voltage to the output terminal 141 in accordance with the control signals 31. The output circuit 120 corresponds to an example of the output means in the input device 10 for outputting the voltage selected from the first voltage and the second voltage. FIG. 3 illustrates a schematic circuit configuration of the output circuit 120. As illustrated in FIG. 3, the output circuit 120 includes a transistor 121 and a relay 122 as switching elements.

The transistor 121 is a PNP bipolar transistor to apply the first voltage V1 to the output terminal 141 in accordance with the first control signal 311 contained in the control signals 31. The emitter of the transistor 121 receives the first voltage applied as the power supply voltage V1, the base connected to the output controller 111 receives the current signal input as the first control signal 311, and the collector is connected to the output terminal 141 via a connecting point P1. The connecting point P1 receives the first voltage while the first control signal 311 is in the on state, and receives no first voltage while the first control signal 311 is in the off state.

The relay 122 is a mechanical relay or a semiconductor relay, for example. The following description is directed to an example in which the relay 122 is a mechanical relay. The relay 122 includes a coil and a switch, which corresponds to a contact to be closed by electromagnetic force generated by a current flow in the coil. One terminal of the coil is connected to the output controller 111, and the other terminal is connected to the ground. The coil receives the current signal input as the second control signal 312 contained in the control signals 31. The current signal in the on state turns the switch of the relay 122 into the closed state, and the current signal in the off state turns the switch into the open state. One terminal of the switch is connected to the negative voltage generating circuit 130 and receives the second voltage, which is a negative voltage, and the other terminal is connected to the output terminal 141 via the connecting point P1.

The connecting point P1 is connected to the output terminal 141 via a connecting point P2, which is connected to the ground via a resistor.

FIG. 4 illustrates a relationship between the states of the control signals 31 and the output voltage from the output circuit 120. As illustrated in FIG. 4, when the first control signal 311 is in the on state while the second control signal 312 is in the off state, the output voltage is the first voltage V1. In contrast, when the first control signal 311 is in the off state while the second control signal 312 is in the on state, the output voltage is the second voltage V2. When the first control signal 311 and the second control signal 312 are both in the off state, the output voltage is a reference voltage equal to the ground electric potential.

Figure 5:
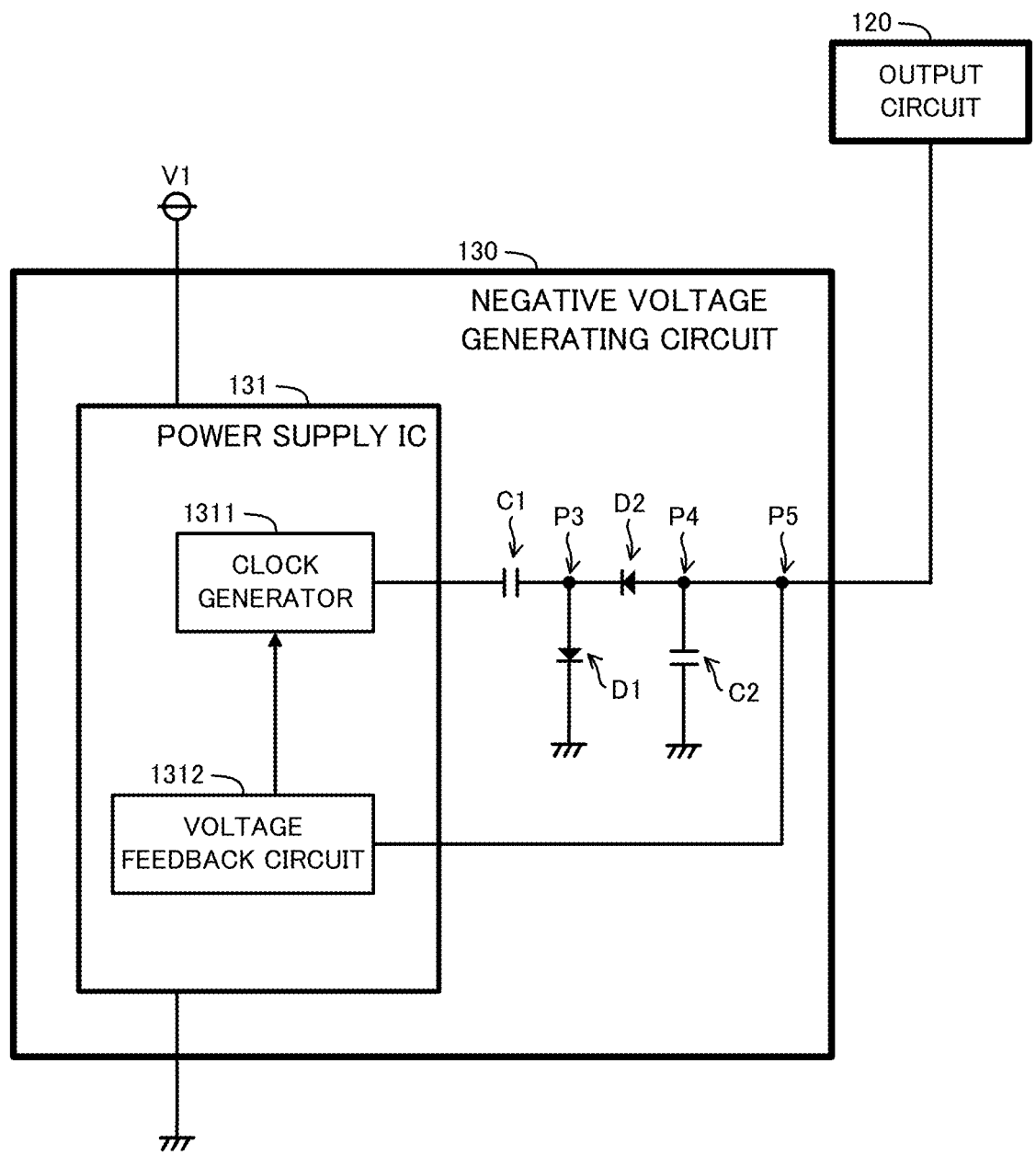
FIG. 5 illustrates a configuration of a negative voltage generating circuit according to Embodiment 1.

The negative voltage generating circuit 130 generates the second voltage, which is a negative voltage. FIG. 5 illustrates a schematic circuit configuration of the negative voltage generating circuit 130. As illustrated in FIG. 5, the negative voltage generating circuit 130 includes a power supply IC 131, capacitors C1 and C2, and diodes D1 and D2.

The power supply IC 131 is an element to generate a clock signal for causing a charge pump to generate a negative voltage. The power supply IC 131 is connected to the power supply and to the ground, and also connected to the output circuit 120 via the capacitor C1 and the diode D2 in the order mentioned. The power supply IC 131 includes a clock generator 1311 to generate a clock signal and switches the voltage to be applied to the capacitor C1, and a voltage feedback circuit 1312 to monitor the voltage at a connecting point P5 that connects the diode D2 to the output circuit 120 and control the generation of the clock signal at the clock generator 1311.

One terminal of the capacitor C1 is connected to the clock generator 1311 of the power supply IC 131, while the other terminal is connected to the cathode of the diode D2 via a connecting point P3. The connecting point P3 is connected to the ground via the diode D1. The anode of the diode D1 is connected to the connecting point P3, and the cathode is connected to the ground. The anode of the diode D2 is connected to the connecting point P5 via a connecting point P4, which is connected to the ground via the capacitor C2.

In the negative voltage generating circuit 130 having such a circuit configuration, the voltage applied to the capacitor C2 decreases after every switching operation of the clock generator 1311. The voltage feedback circuit 1312 stops the switching operation at the clock generator 1311 when the voltage at the capacitor C2 is lower than the second voltage serving as the target value, and causes the clock generator 1311 to execute the switching operation when the voltage at the capacitor C2 is higher than the second voltage. This feedback function of the voltage feedback circuit 1312 makes the voltage at the connecting point P5 equal to the second voltage. The negative voltage generating circuit 130 thus generates the second voltage, which is a negative voltage.

Referring back to FIG. 2, the output terminal 141 and the input terminal 142 are connected to mutually different terminals of the switch 20 via wires. Although the switch 20 is an emergency stop button manipulated by the user 22 in the above-described example, this configuration is a mere example. The switch 20 may be any machine to open and close the electrical connection between the output terminal 141 and the input terminal 142. For example, the switch 20 may be a sensor that is installed at a belt conveyor and becomes an open state when coming into contact with a workpiece, or may be a switching element included in a robot.

The input circuit 150 receives an input voltage input to the input terminal 142, generates input signals 33 corresponding to the input voltage, and transmits the first input signal 331 of the input signals 33 to the diagnoser 112 and the generator 113, and the second input signal 332 to the generator 113. The input signals 33 contribute to determination whether the input voltage is equal to the first voltage output from the output circuit 120 while the switch 20 is in the closed state, or the second voltage output from the output circuit 120 while the switch 20 is in the closed state, or the reference voltage applied while the switch 20 is in the open state. The reference voltage is equal to the ground electric potential. The input circuit 150 corresponds to an example of input means in the input device 10 for receiving the voltage input from the output means via the switch in the closed state and outputting an input signal corresponding to the input voltage.

Figure 6:
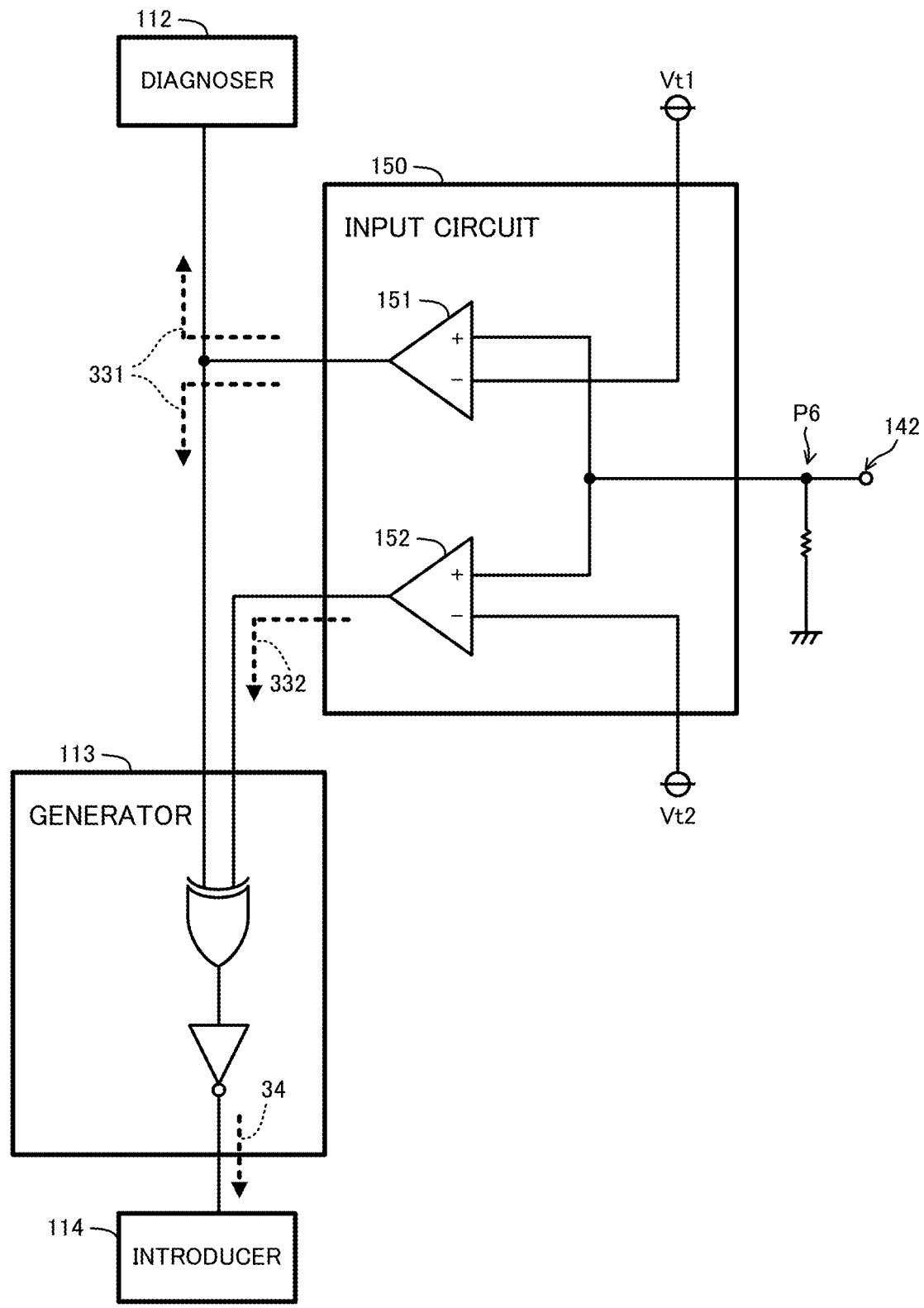
FIG. 6 illustrates a configuration of an input circuit according to Embodiment 1.

FIG. 6 illustrates a schematic circuit configuration of the input circuit 150. As illustrated in FIG. 6, the input circuit 150 includes comparators 151 and 152 to which the input voltage applied to the input terminal 142 is input via a connecting point P6. The connecting point P6 is connected to the ground via a pull-down resistor. The input circuit 150 receives the input voltage equal to the output voltage while the switch 20 is in the closed state, and receives the reference voltage equal to the ground electric potential while the switch 20 is in the open state. Although the connecting point P6 connected to the pull-down resistor is disposed between the input terminal 142 and the input circuit 150 in the example illustrated in FIG. 6, this configuration is a mere example. The connecting point P6 may also be disposed between the input terminal 142 and the switch 20.

The comparator 151 compares voltages in order to determine whether the input voltage is equal to the first voltage. In detail, the comparator 151 compares the input voltage with the first threshold voltage Vt1 lower than the first voltage and higher than the reference voltage, and outputs the first input signal 331 at a high level when the input voltage is higher than the first threshold voltage Vt1, and outputs the first input signal 331 at a low level when the input voltage is lower than the first threshold voltage Vt1. The first threshold voltage is 12 V, for example, and can be obtained by dividing the power supply voltage of 24 V. The first input signal 331 is at a high level when the input voltage is equal to the first voltage, and at a low level when the input voltage is equal to the second voltage or the reference voltage. That is, the first input signal 331 indicates whether the input voltage is higher than the first threshold voltage. The comparator 151 then transmits the first input signal 331 to the diagnoser 112 and the generator 113.

The comparator 152 compares voltages in order to determine whether the input voltage is equal to the second voltage. In detail, the comparator 152 compares the input voltage with the second threshold voltage Vt2 lower than the reference voltage and higher than the second voltage, and outputs the second input signal 332 at a high level when the input voltage is higher than the second threshold voltage Vt2, and outputs the second input signal 332 at a low level when the input voltage is lower than the second threshold voltage Vt2. The second threshold voltage is −6 V, for example, and is obtained by dividing the negative voltage of −12 V generated at the negative voltage generating circuit 130. The second input signal 332 is at a low level when the input voltage is equal to the second voltage, and at a high level when the input voltage is equal to the first voltage or the reference voltage. That is, the second input signal 332 indicates whether the input voltage is higher than the second threshold voltage. The comparator 152 then transmits the second input signal 332 to the generator 113.

The generation of the state signal 34 at the generator 113 is described below. As illustrated in FIG. 6, the generator 113 outputs the NOT of exclusive OR of the first input signal 331 and the second input signal 332, in the form of the state signal 34. This logical operation is executed such that the high levels of the first input signal 331 and the second input signal 332 are deemed as true or 1 while the low levels are deemed as false or 0. FIG. 7 illustrates a relationship between the levels of the two input signals 33 and the value of the state signal 34. In detail, when the input voltage Vi is higher than the first threshold voltage Vt1, the two input signals 33 are both at a high level, as represented by "H", resulting in the state signal 34 having a value of "1". When the input voltage Vi is higher than the second threshold voltage Vt2 and lower than the first threshold voltage Vt1, the first input signal 331 is at a low level, as represented by "L", and the second input signal 332 is at a high level, resulting in the state signal 34 having a value of "0". When the input voltage Vi is lower than the second threshold voltage Vt2, the two input signals 33 are both at a low level, resulting in the state signal 34 having a value of "1". In summary, the generator 113 generates the state signal 33 indicating the closed state of the switch 20 when the first input signal 331 indicates that the input voltage is higher than the first threshold voltage or when the second input signal 332 indicates that the input voltage is lower than the second threshold voltage, and generates the state signal 33 indicating the open state of the switch 20 when the first input signal 331 indicates that the input voltage is lower than the first threshold voltage while the second input signal 332 indicates that the input voltage is higher than the second threshold voltage. In other words, when the input voltage is equal to either one of the first voltage and the second voltage, that is, when the switch 20 is in the closed state, the state signal 34 has a value of "1" indicating the closed state of the switch 20. In contrast, when the input voltage is equal to the reference voltage, that is, when the switch 20 is in the open state, the state signal 34 has a value of "0" indicating the open state of the switch 20.

Figure 8:
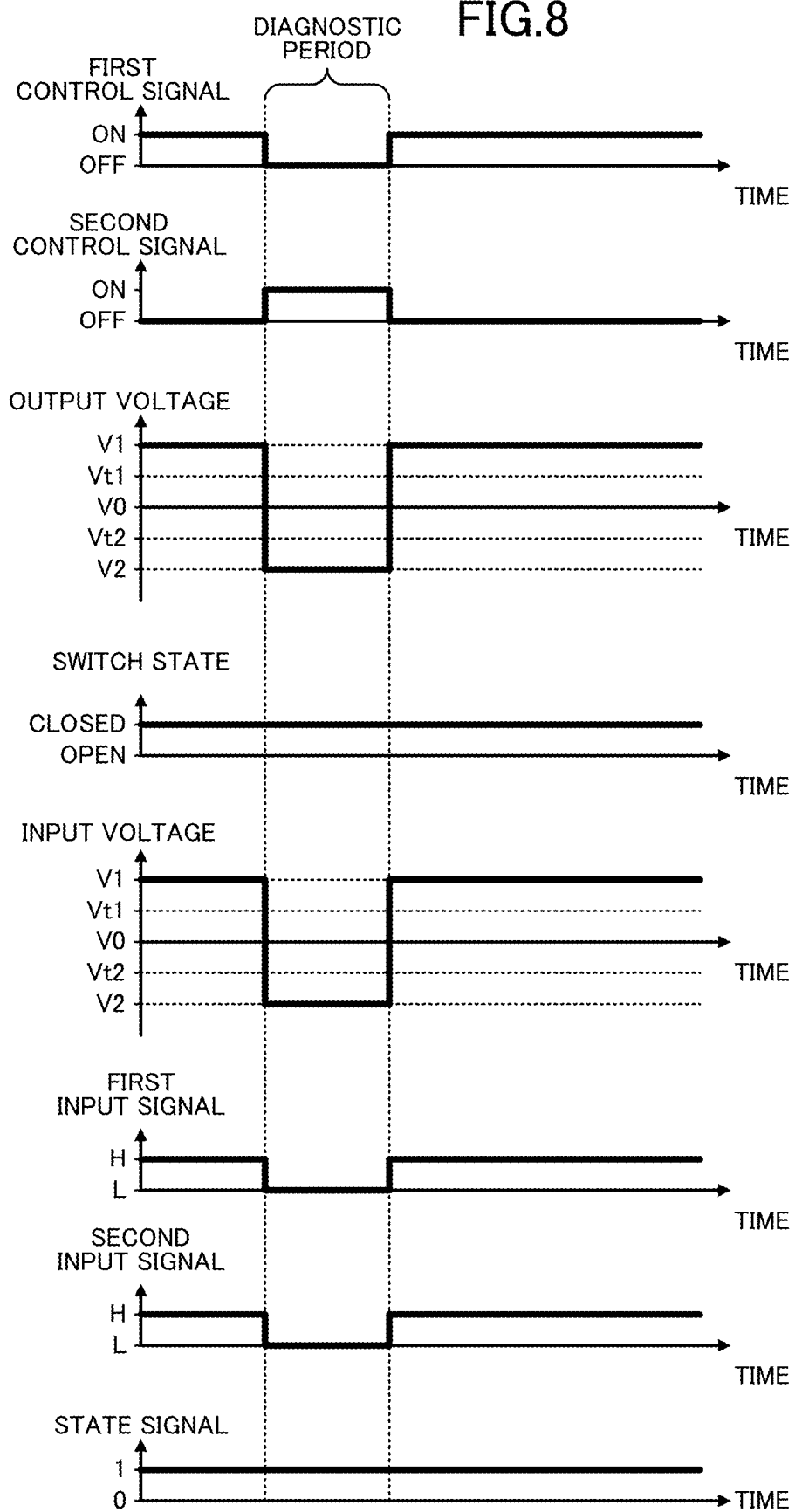
FIG. 8 illustrates transition of signals in the case where diagnosis is performed according to Embodiment 1.

FIG. 8 is a timing chart illustrating transition of signals in the case where diagnosis is performed in the input device 10. As illustrated in FIG. 8, during a normal period without execution of diagnosis, the first control signal 311 is in the on state while the second control signal 312 is in the off state, and the output voltage from the output circuit 120 is the first voltage V1. During a diagnostic period, the first control signal 311 is in the off state and the second control signal 312 is in the on state, and the output voltage from the output circuit 120 is the second voltage V2. Since the state of the first input signal to be diagnosed differs between the normal period and the diagnostic period, the diagnoser 112 diagnoses the conduction state to be normal.

When the switch 20 maintains the closed state without being switched, the input voltage shifts like the output voltage. The two input signals 33, which are both at a high level during the normal period, are both at a low level during the diagnostic period. In both of the case where the input signals 33 are both at a high level and the case where the input signals 33 are both at a low level, the state signal 34 has a value of "1", as illustrated in FIG. 7. The state signal 34 thus does not shift from the value of "1" in FIG. 8.

Figure 9:
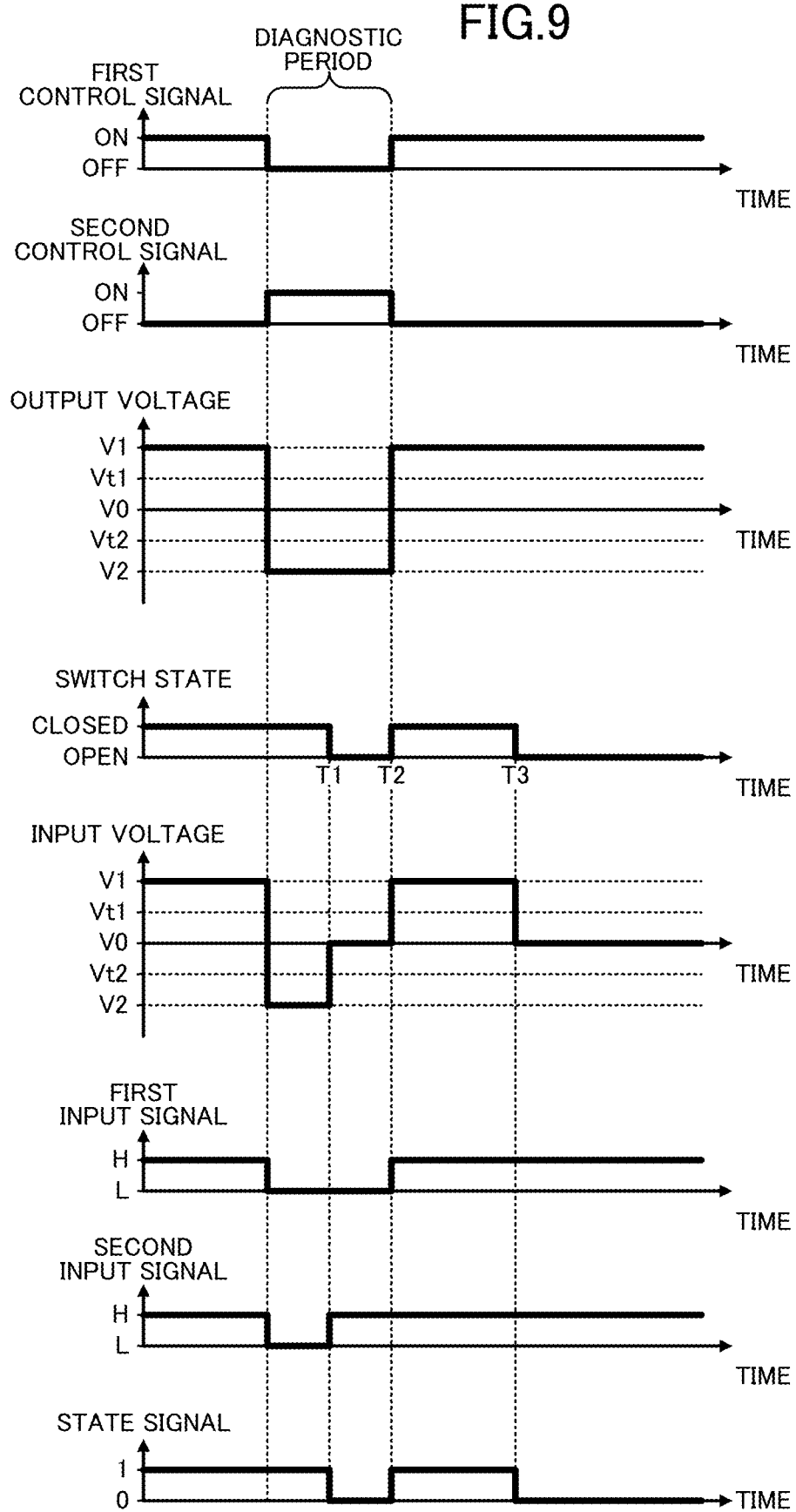
FIG. 9 illustrates transition of signals before and after switching of the state of a switch according to Embodiment 1.

FIG. 9 is a timing chart illustrating transition of signals before and after manipulation of the switch 20. In the example illustrated in FIG. 9, the switch 20 is in the open state from the time T1 until the time T2 within a diagnostic period, is temporarily turned into the closed state during the subsequent normal period, and is then turned into the open state again at the time T3. While the switch 20 is in the open state, the input voltage is equal to the reference voltage. The first input signal 331 shifts as in the example illustrated in FIG. 8. In contrast, the second input signal 332 shifts to a high level while the switch 20 is in the open state. That is, the second input signal 332 is at a low level from the beginning of the diagnostic period until the time T1. In the case where the two input signals 33 are at different levels, the state signal 34 has a value of "0", as illustrated in FIG. 7. The state signal 34 thus has a value of "0" during the period from the time T1 until the time T2 and the period from the time T3.

As is apparent from FIGS. 8 and 9, the state signal 34 shifts in accordance with the state of the switch 20 and is therefore deemed to indicate the state of the switch 20.

Figure 10:
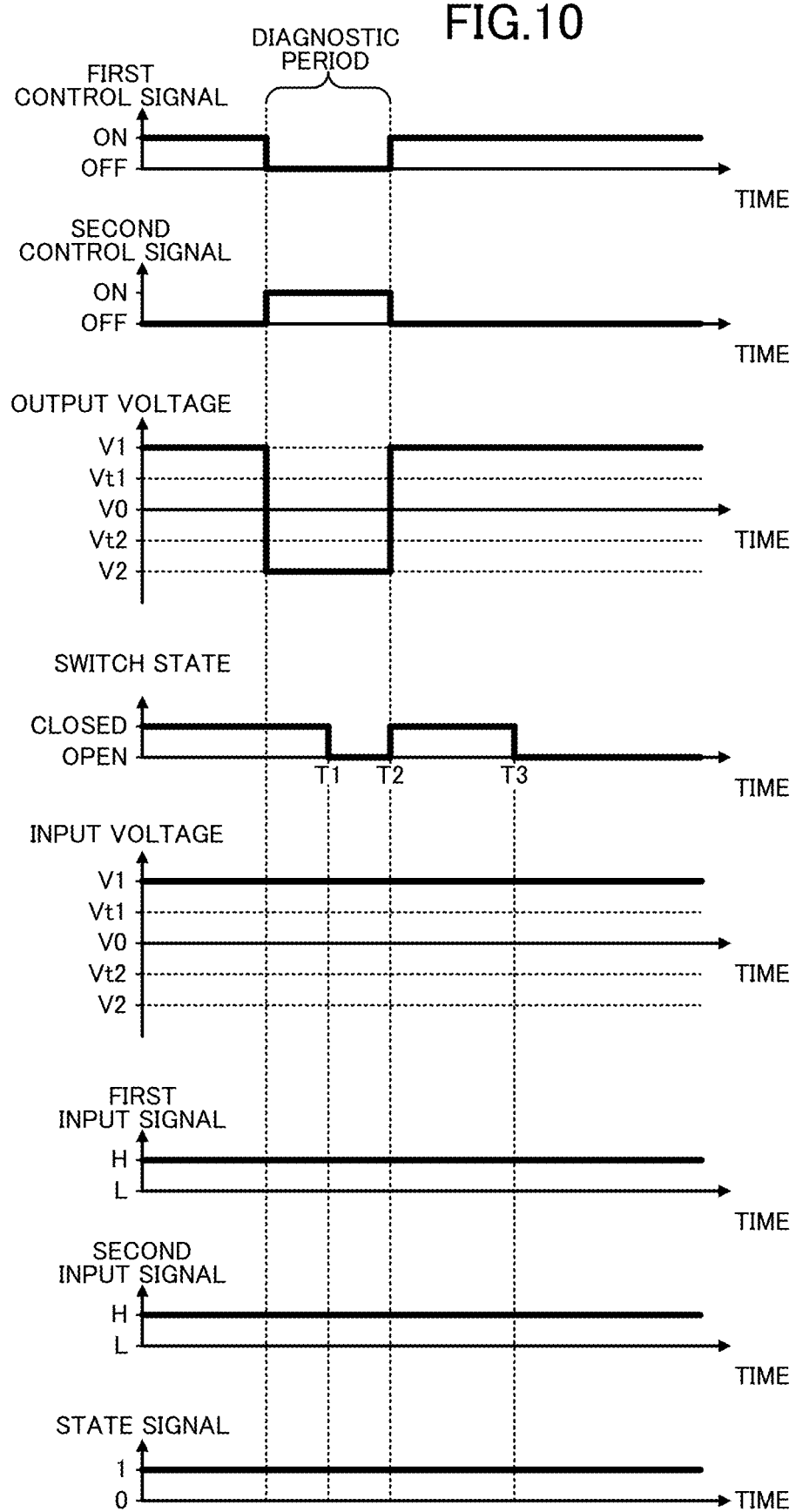
FIG. 10 illustrates transition of signals in the case where the conduction state is diagnosed to be abnormal in the input device according to Embodiment 1.

FIG. 10 illustrates transition of signals in the case where the diagnoser 112 diagnoses the conduction state to be abnormal. In the example illustrated in FIG. 10, the input voltage is stuck at the first voltage V1 regardless of the state of the switch 20. The input voltage may be stuck as illustrated in FIG. 10 in the case of any failure in the path from the output circuit 120 via the switch 20 to the input circuit 150. In this case, since the first input signal 331 is stuck at the high level and does not shift regardless of a diagnostic period, the diagnoser 112 diagnoses the conduction state to be abnormal.

Figure 11:
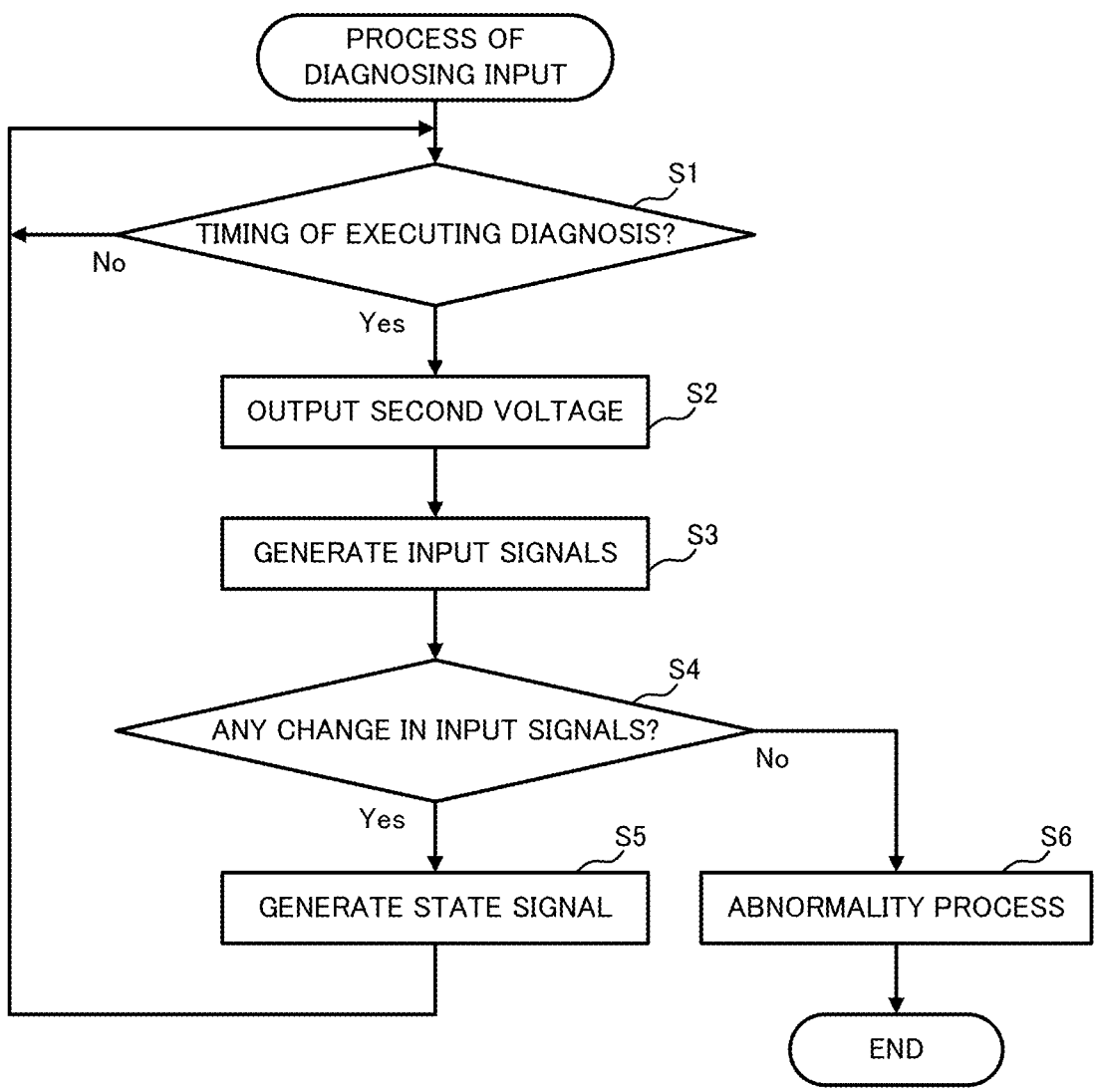
FIG. 11 is a flowchart illustrating a process of diagnosing input according to Embodiment 1.

A process of diagnosing input executed in the input device 10 is described below with reference to FIG. 11. Although the process of diagnosing input illustrated in FIG. 11 represents an operation of the input device 10 during a diagnostic period, the actual operation of the input device 10 does not necessarily accord with the order illustrated in FIG. 11. For example, although the step of generating the input signals 33 at the input circuit 150 is represented as Step S3 in FIG. 11, the input circuit 150 is generating input signals corresponding to the input voltage all the time. That is, Step S3 in FIG. 11 indicates the generation of input signals caused by execution of Step S2 for descriptive purposes.

In the process of diagnosing input, the input device 10 determines whether the current time corresponds to the timing of diagnosis (Step S1). Specifically, the processor 110 determines whether a predetermined period has elapsed since the previous diagnosis. Examples of the predetermined period include, one minute, one hour, and one day.

When determining that the current time does not correspond to the timing of diagnosis (Step S1; No), the input device 10 repeats the determination in Step S1 and waits until the timing of diagnosis. In contrast, when determining that the current time corresponds to the timing of diagnosis (Step S1; Yes), the input device 10 outputs the second voltage (Step S2). Specifically, the output controller 111 changes the values of the control signals 31, and thereby shifts the output voltage from the output circuit 120 from the first voltage to the second voltage. The output circuit 120 thereby outputs the second voltage.

The input device 10 then generates input signals 33 (Step S3). Specifically, the input circuit 150 generates a first input signal 331 and a second input signal 332 corresponding to the input voltage. Step S3 corresponds to an example of an input step, in the method of diagnosing input, of outputting an input signal that is based on the input voltage input via the switch 20 in the closed state, which is selected from the first voltage and the second voltage.

The input device 10 then determines whether any change occurs in the input signals (Step S4). Specifically, the diagnoser 112 determines whether any change occurs in the first input signal 331 of the input signals 33 at the begging of a diagnostic period in which the output circuit 120 outputs the second voltage. Step S4 corresponds to an example of a diagnosis step, in the method of diagnosing input, of determining whether any change occurs in the input signal in response to switching of the input voltage to the second voltage.

When determining that any change occurs in the input signals (Step S4; Yes), the input device 10 generates a state signal 34 (Step S5). Specifically, the generator 113 generates a state signal 34 indicating the value obtained from the values of the two input signals 33 by logical operation, and outputs the generated state signal 34 to the introducer 114. Step S5 corresponds to an example of a generation step, in the method of diagnosing input, of generating a state signal on the basis of the input signal. The input device 10 then repeats Step S1 and the following steps.

In contrast, when determining that no change occurs in the input signals (Step S4; No), the input device 10 executes an abnormality process (Step S6). Specifically, the diagnoser 112 provides a notification of abnormality to the outside. The process of diagnosing input is then terminated.

As described above, the diagnoser 112 determines whether any change occurs in the input signals 33 in response to switching of the voltage output from the output circuit 120 to the second voltage. The diagnoser 112 thereby confirms whether the conduction state between the input device 10 and the switch 20 is normal. Furthermore, the generator 113 generates the state signal 34 indicating the state of the switch 20 on the basis of the input signals 33 corresponding to the input voltage. Since the input voltage is equal to the voltage selected from the first voltage and the second voltage while the switch 20 is in the closed state, the state signal 34 can be generated directly from the input signals corresponding to the input voltage. This configuration does not require filtering of the signals and can thus improve the input responsiveness of the input device 10 in parallel to execution of self-diagnosis.

The diagnoser 112 determines whether any change occurs in the input signals 33. The diagnoser 112 thus diagnoses the conduction state to be normal when the input voltage shifts from the first voltage to the second voltage. In addition, the diagnoser 112 diagnoses the conduction state to be normal when an external force turns the switch 20 to the open state so that the input voltage becomes equal to the reference voltage during a diagnostic period. That is, the diagnoser 112 can execute diagnosis regardless of the open or closed state of the switch 20.

The input circuit 150 receives the reference voltage lower than the first voltage when the switch 20 is in the open state, and the second voltage is lower than the reference voltage. The input circuit 150 then outputs the first input signal 331 and the second input signal 332 as the input signals, and the generator 113 generates the state signal 34 indicating the state of the switch 20 from these input signals. The self-diagnosis is thus executed using the voltage range from the first voltage to the second voltage, which is larger than the voltage range from the first voltage to the reference voltage. This configuration can improve the input responsiveness without reducing a noise margin.

Figure 12:
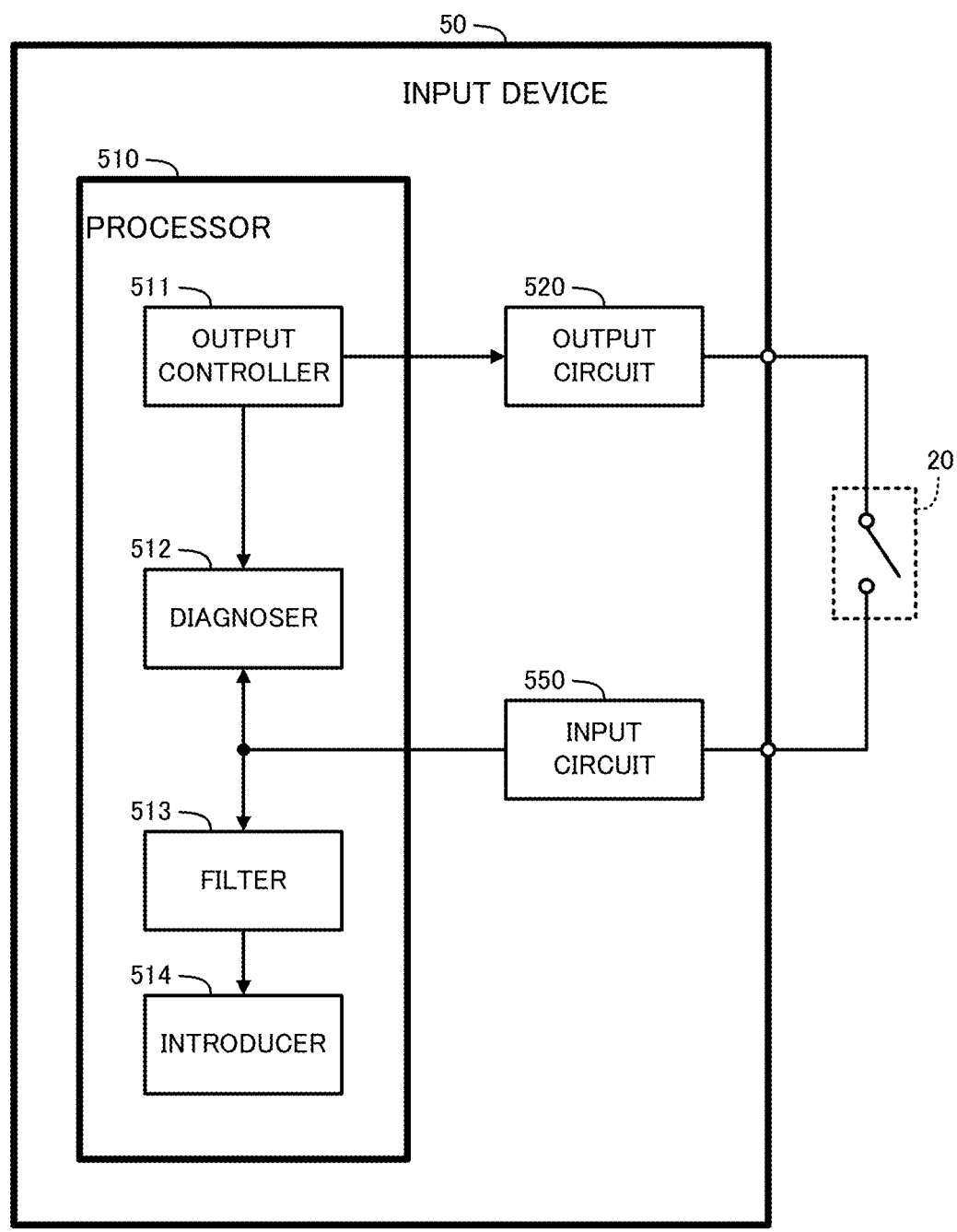
FIG. 12 illustrates a configuration of an input device according to a comparative example.

An example to be compared with the input device 10 according to the embodiment is described below. In this comparative example, the output voltage is not selected from output voltages at two levels but fixed at a single level. An input device 50 illustrated in FIG. 12 includes a processor 510 corresponding to the processor 110 of the input device 10, an output circuit 520 to output a voltage under instructions from the processor 510, and an input circuit 550 to output an input signal corresponding to the input voltage.

The processor 510 includes an output controller 511 to control the output of voltage from the output circuit 520, a diagnoser 512 to determine whether any change occurs in the input signal output from the input circuit 550, a filter 513 to filter the input signal and thereby remove the high-frequency components, and an introducer 514 to introduce the filtered signal. The output controller 511 adjusts the diagnostic period to a sufficiently short period for removal of high-frequency components through filtering at the filter 513. During this diagnostic period, the output controller 511 shifts the output voltage output from the output circuit 520 to the reference voltage.

Figure 13:
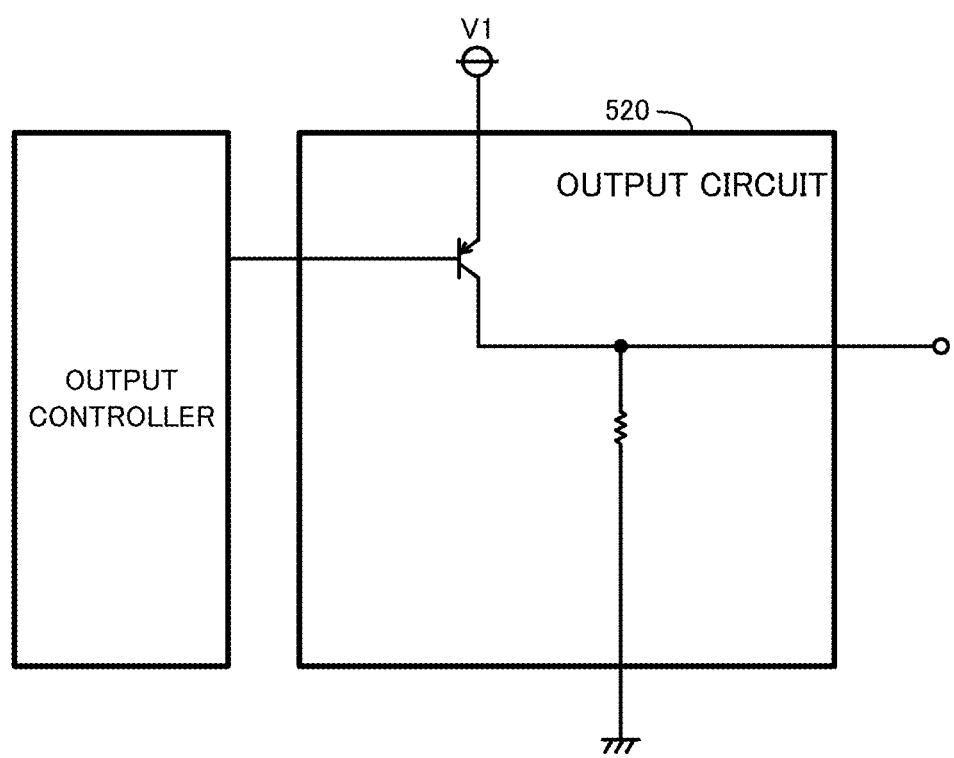
FIG. 13 illustrates a configuration of an output circuit according to the comparative example.
Figure 14:
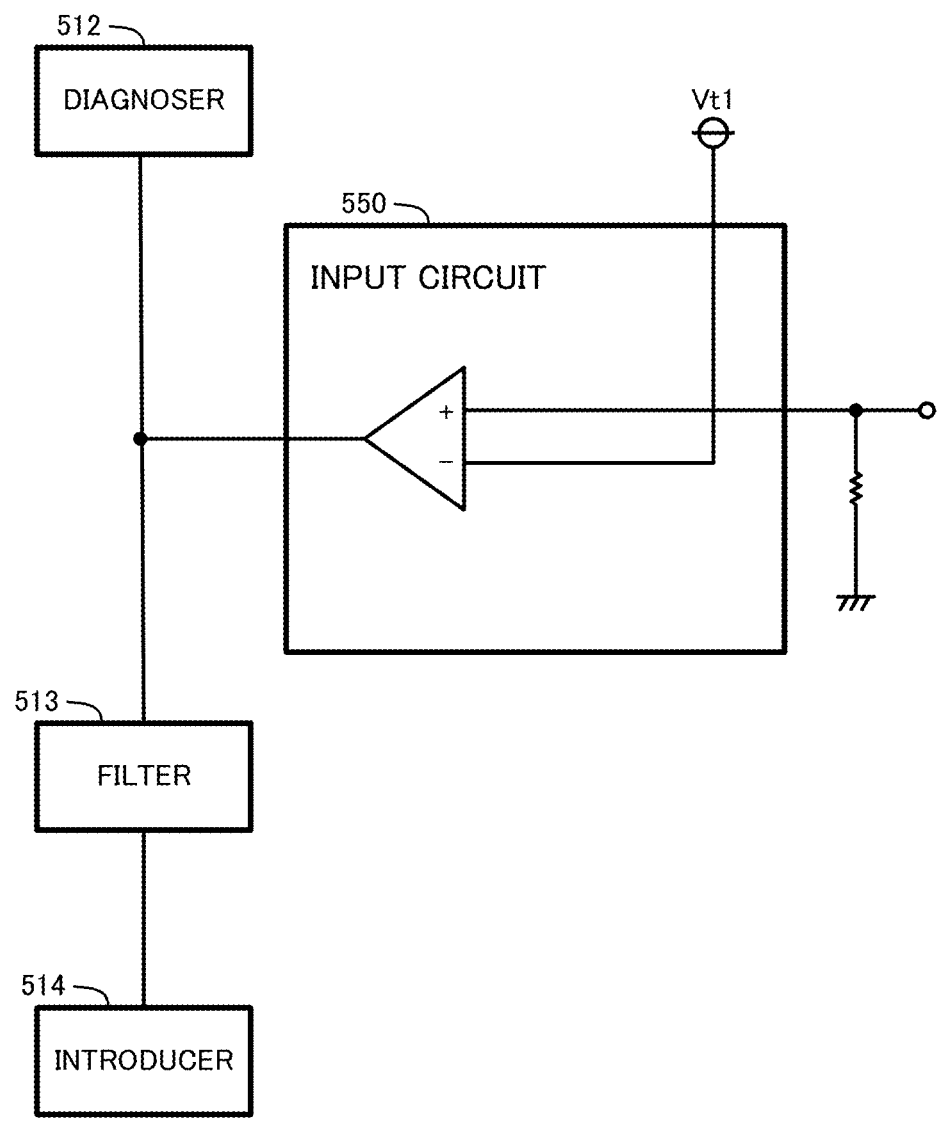
FIG. 14 illustrates a configuration of an input circuit according to the comparative example.

As illustrated in FIG. 13, the output circuit 520 corresponds to a circuit configured by excluding the sections related to the second voltage from the output circuit 120. As illustrated in FIG. 14, the input circuit 550 corresponds to a circuit configured by excluding the sections related to the second input signal 332 from the input circuit 150.

Figure 15:
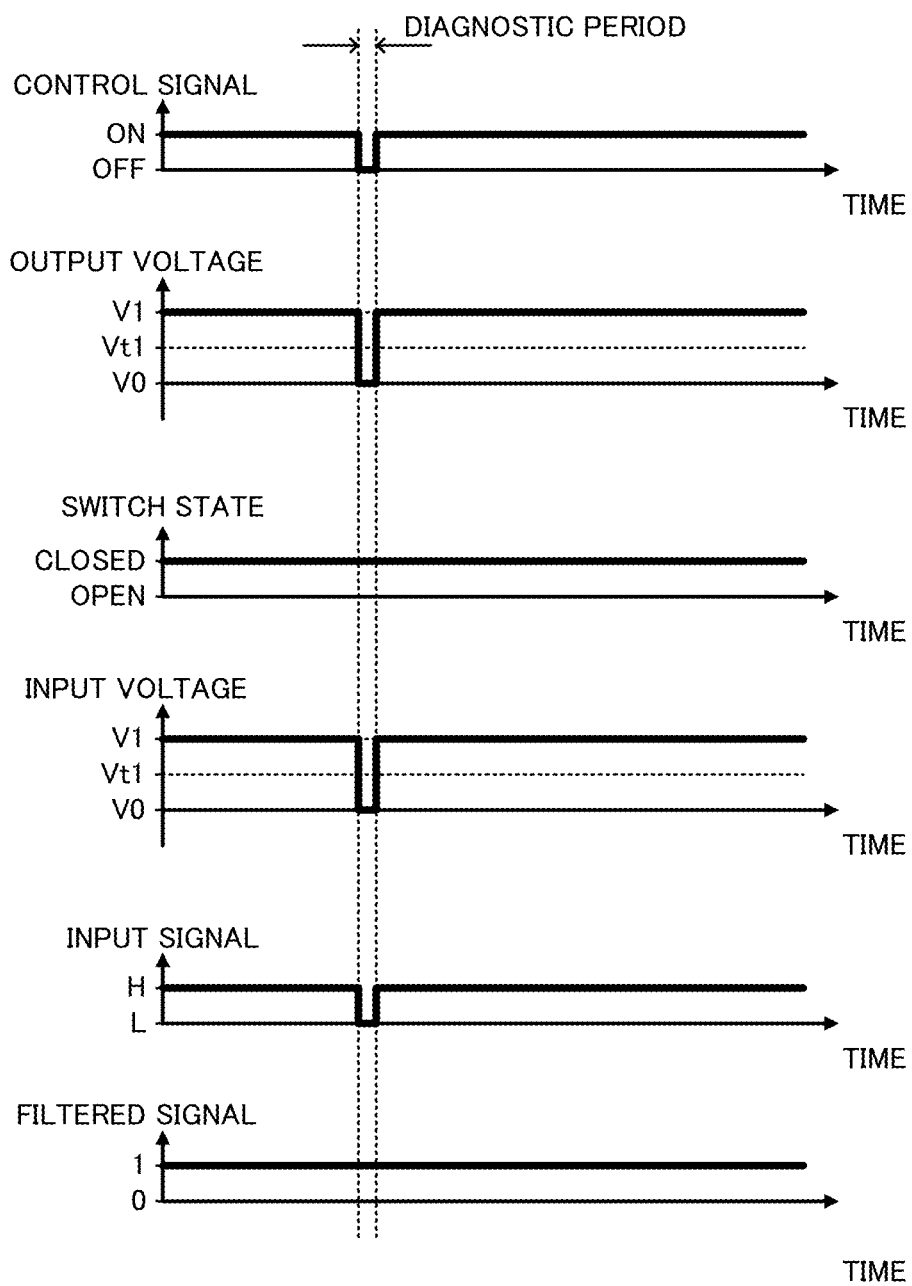
FIG. 15 illustrates transition of signals in the case where diagnosis is performed in the input device according to the comparative example.

FIG. 15 is a timing chart illustrating transition of signals in the case where diagnosis is performed in the input device 50. As illustrated in FIG. 15, the control signal output from the output controller 511 to the output circuit 520 is in the on state during a normal period, and in the off state during a diagnostic period. The output voltage is therefore equal to the first voltage V1 during the normal period, and equal to the reference voltage V0 during the diagnostic period.

While the switch 20 maintains the closed state without being switched, the input voltage input to the input circuit 550 is equal to the output voltage. The input signal is at a high level during the normal period, and is at a low level during the diagnostic period. The filtered signal, obtained through the filtering at the filter 513, does not shift from the value of "1" because the filtering allows only the low-frequency components to pass and removes short pulses.

Figure 16:
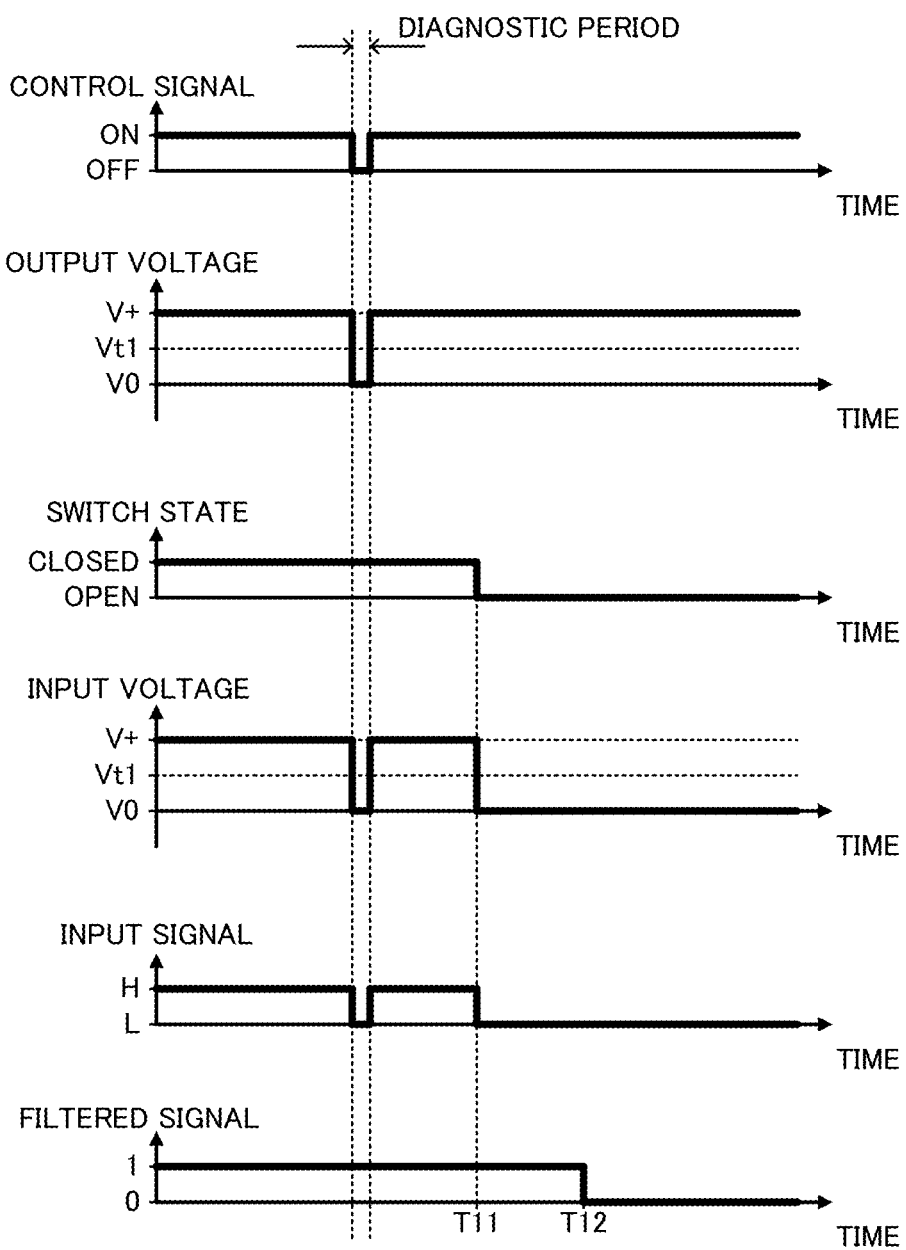
FIG. 16 illustrates transition of signals before and after switching of the state of a switch according to the comparative example.

FIG. 16 is a timing chart illustrating transition of signals before and after manipulation of the switch 20 connected to the input device 50. As illustrated in FIG. 16, the switch 20 is turned into the open state at the time T11, so that the input voltage becomes equal to the reference voltage and the input signal shifts to a low level during the period after the time T11. In contrast, the filtered signal shifts to a value of "0" at the time T12 following the time T11, due to the filtering at the filter 513. Although this input device 50 can achieve diagnosis without mistaking short pulses to be used in self-diagnosis for switch manipulation, but has low input responsiveness to switch manipulation.

Figure 17:
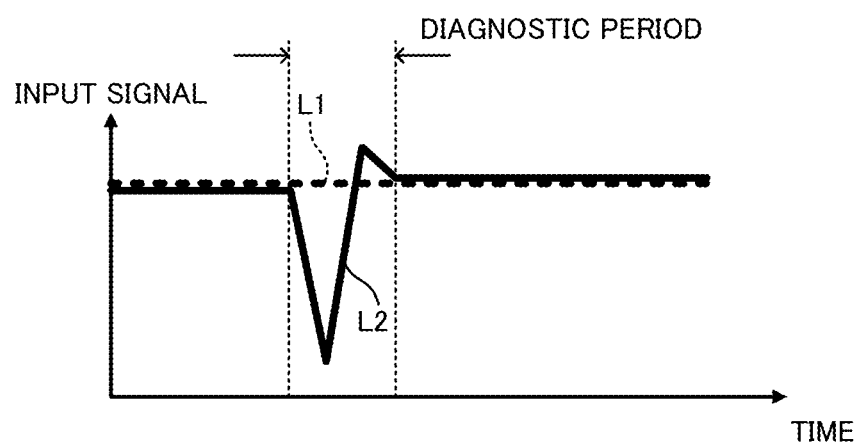
FIG. 17 is a first diagram for describing effects of noise on the input device according to the comparative example.

In addition, the self-diagnosis using short pulses is susceptible to effects of noise. For example, FIG. 17 illustrates an example in which the input voltage is stuck during a diagnostic period. The input signal is expected to be constant as represented by the line L1, but is distorted by the effects of noise as represented by the line L2. In this example, the conduction state may be wrongly diagnosed to be normal, although the conduction state must be diagnosed to be abnormal because of the stuck input voltage.

Figure 18:
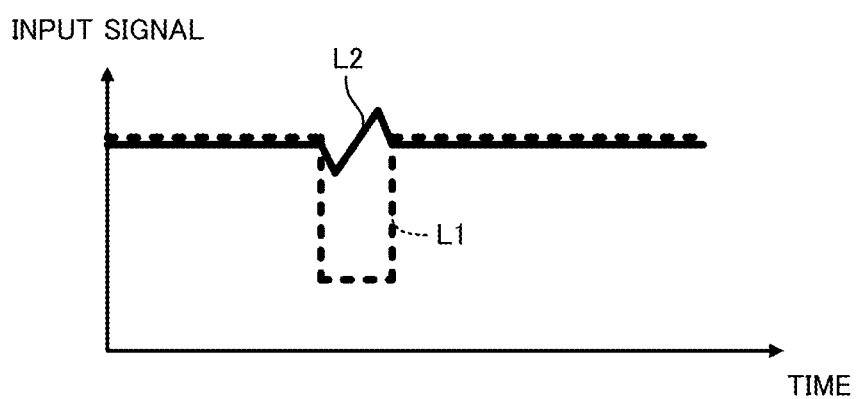
FIG. 18 is a second diagram for describing effects of noise on the input device according to the comparative example.

FIG. 18 illustrates an example in which the input voltage varies during a diagnostic period. The input signal is expected to shift as represented by the line L1, but is distorted by the effects of noise as represented by the line L2. In this example, the conduction state may be wrongly diagnosed to be abnormal, although the conduction state must be diagnosed to be normal because of the variable input voltage.

Figure 19:
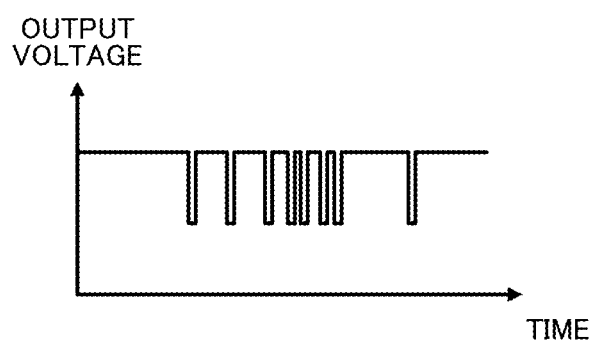
FIG. 19 illustrates an exemplary pulse train according to the comparative example.

In the above-mentioned technique disclosed in Patent Literature 1, the diagnosis requires determination whether complicated pulse trains match each other. This technique can avoid wrong diagnosis leading to unnoticed abnormality as illustrated in FIG. 17, because of sufficiently low probability of occurrence of noise that matches the complicated pulse train as illustrated in FIG. 19, for example. In this technique, unfortunately, the conduction state is diagnosed to be abnormal unless all the pulses constituting the pulse train match each other. When any of the pulses constituting the pulse train is distorted by the effects of noise as illustrated in FIG. 18, the conduction state is wrongly diagnosed to be abnormal.

In addition, while the switch 20 is in the open state during a diagnostic period, the above-mentioned technique disclosed in Patent Literature 1 cannot achieve accurate diagnosis because the pulse train is not input to the input circuit 550. Specifically, the conduction state, which is actually normal, may be diagnosed to be abnormal while the switch 20 is in the open state.

In contrast, the input device 10 according to the embodiment can discriminate between a variation in the input voltage for diagnosis and a variation in the input voltage caused by switch manipulation, on the basis of the voltage level. The input device 10 therefore does not require a filtering process as in the input device 50 for discriminating between the pulse train for diagnosis and the pulses caused by switch manipulation. The diagnostic period thus does not have to be short and can be extended to some extent, resulting in no effects of noise to be superimposed on short pulses. Furthermore, the input device 10 can achieve accurate diagnosis regardless of the open state of the switch 20 during the diagnostic period.

Although the input device 10 does not require a filtering process as described above, the input device 10 may perform a filtering process to remove noise, for example, within the range of maintaining the input responsiveness. Although the input device 10 provides a notification of abnormality without generating the state signal 34 when diagnosing the conduction state to be abnormal in FIG. 11, the input device 10 may generate the state signal 34 as well as providing a notification of abnormality.

Embodiment 2

Embodiment 2 is described below focusing on the differences from Embodiment 1 described above. The components identical or corresponding to those in Embodiment 1 are provided with the same reference symbol. This embodiment differs from Embodiment 1 in that the second voltage is higher than the reference voltage.

Figure 20:
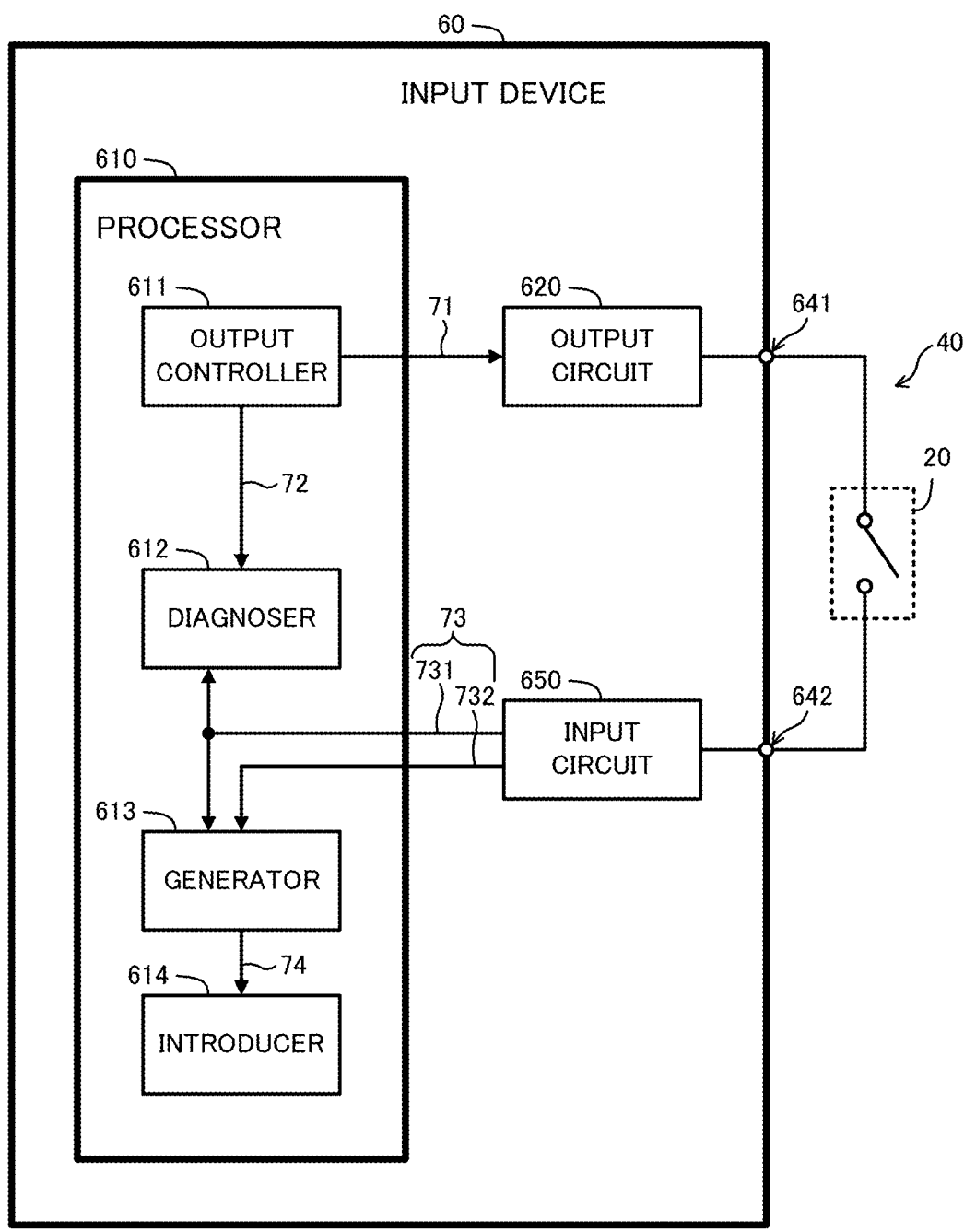
FIG. 20 illustrates a configuration of an input device according to Embodiment 2.

As illustrated in FIG. 20, an input device 60 according to the embodiment includes a processor 610, an output circuit 620, an output terminal 641 and an input terminal 642, and an input circuit 650. The processor 610 includes an output controller 611 to control the output of voltage from the output circuit 620, a diagnoser 612 to determine whether any change occurs in input signals 73 generated at the input circuit 650, a generator 613 to generate a state signal 74 indicating the state of the switch 20 from the input signals 73, and an introducer 614 to introduce the state signal 74.

The output controller 611 transmits control signals 71 to the output circuit 620 and thereby causes the output circuit 620 to output a voltage corresponding to the control signals 71. The control signals 71 correspond to the control signals 31, and contain a first control signal for output of a first voltage and a second control signal for output of a second voltage, as illustrated in FIG. 4. The output controller 611 transmits the control signals 71 containing the first control signal in the on state and the second control signal in the off state during a normal period, and thereby causes the output circuit 620 to output an output voltage of 24 V, for example, as the first voltage. The output controller 611 transmits the control signals 71 containing the first control signal in the off state and the second control signal in the on state during a diagnostic period, and thereby causes the output circuit 620 to output an output voltage of 12 V, as the second voltage, which is lower than the first voltage and higher than the reference voltage. The output controller 611 also transmits a period signal 72 indicating whether the current time is within a diagnostic period to the diagnoser 612.

The diagnoser 612 receives the period signal 72 from the output controller 611, and receives a first input signal 731 of the input signals 73 generated at the input circuit 650 from the input circuit 650. The diagnoser 612 then determines whether any change occurs in the first input signal 731.

The generator 613 receives the input signals 73 generated at the input circuit 650. The input signals 73 contain the first input signal 731 and a second input signal 732. Each of the first input signal 731 and the second input signal 732 is a 1-bit signal having either one of the high and low voltage levels corresponding to the voltage values of the input voltage. In terms of being 1-bit signals, the first input signal 731 and the second input signal 732 are the same as the first input signal 331 and the second input signal 332, respectively. The difference between the first input signal 731 and the first input signal 331 and the difference between the second input signal 732 and the second input signal 332 are described below. The generator 613 generates the state signal 74 indicating the open or closed state of the switch 20 from these input signals 73 by logical operation, and transmits the generated state signal 74 to the introducer 614.

Figure 21:
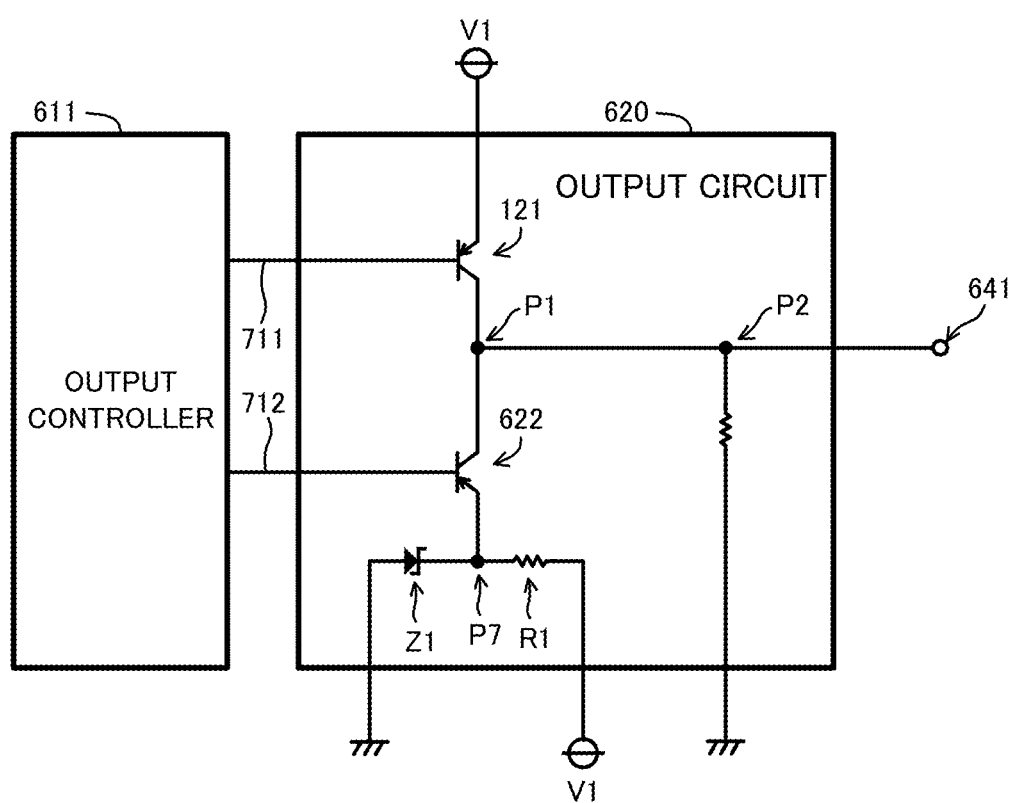
FIG. 21 illustrates a configuration of an output circuit according to Embodiment 2.

The output circuit 620 outputs an output voltage selected from the first voltage and the second voltage to the output terminal 641 in accordance with the control signals 71. FIG. 21 illustrates a schematic circuit configuration of the output circuit 620. As illustrated in FIG. 21, the output circuit 620 differs from the output circuit 120 according to Embodiment 1 in that the output circuit 620 includes a transistor 622, a resistor R1, and a Zener diode Z1 as switching elements, instead of the relay 122.

The transistor 622 is a PNP bipolar transistor to apply the second voltage V2 to the output terminal 641 in accordance with the second control signal 712 contained in the control signals 71. The emitter of the transistor 622 is connected to a connecting point P7 that connects the Zener diode Z1 to the resistor R1, the base connected to the output controller 611 receives a current signal input as the second control signal 712, the collector is connected to the output terminal 641 via the connecting point P1. The anode of the Zener diode Z1 is connected to the ground, and the cathode is connected to the connecting point P7. One end of the resistor R1 is connected to the connecting point P7, and the other end receives the power supply voltage V1. The connecting point P1 receives the second voltage V2 obtained by dividing the first voltage V1 at the resistor R1 while the second control signal 712 is in the on state, and receives no second voltage while the second control signal 712 is in the off state.

Referring back to FIG. 20, the output terminal 641 and the input terminal 642 are connected to mutually different terminals of the switch 20 via wires.

Figure 22:
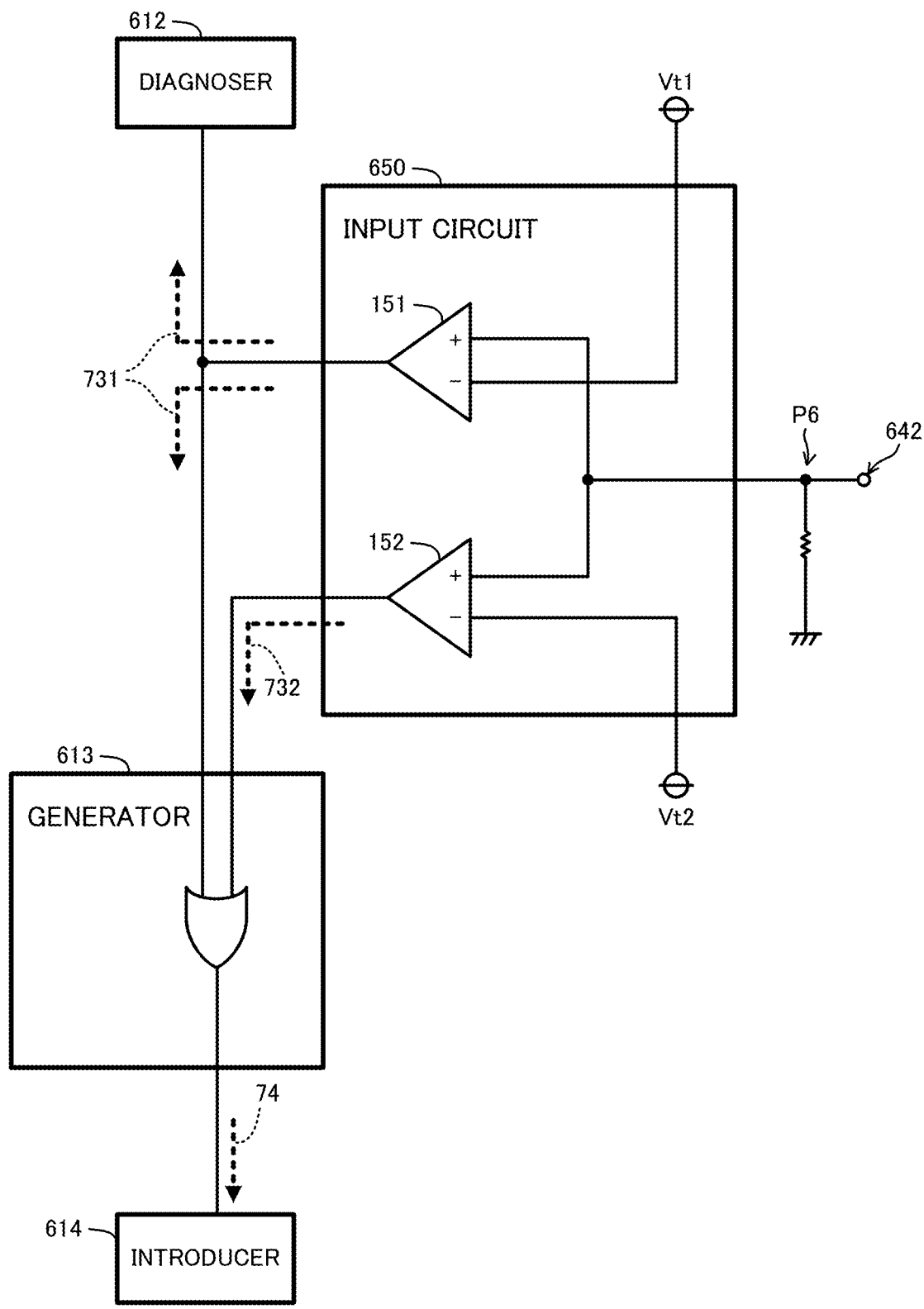
FIG. 22 illustrates a configuration of an input circuit according to Embodiment 2.

The input circuit 650 receives an input voltage input to the input terminal 642, generates input signals 73 corresponding to the input voltage, and transmits the first input signal 731 of the input signals 73 to the diagnoser 612 and the generator 613, and the second input signal 732 to the generator 613. The input signals 73 contribute to determination whether the input voltage is equal to (i) the first voltage output from the output circuit 620 while the switch 20 is in the closed state, (ii) the second voltage output from the output circuit 620 while the switch 20 is in the closed state, or (iii) the reference voltage applied while the switch 20 is in the open state. The reference voltage is equal to the ground electric potential. FIG. 22 illustrates a schematic circuit configuration of the input circuit 650. As illustrated in FIG. 22, the input circuit 650 has the same configuration as the input circuit 150 according to Embodiment 1.

The comparator 151 of the input circuit 650 compares the input voltage with a first threshold voltage Vt1 lower than the first voltage and higher than the second voltage. The comparator 151 outputs the first input signal 731 at a high level when the input voltage is higher than the first threshold voltage Vt1, and outputs the first input signal 731 at a low level when the input voltage is lower than the first threshold voltage Vt1. The first threshold voltage is 18 V, for example, and is obtained by dividing the power supply voltage of 24 V. The first input signal 731 is at a high level when the input voltage is equal to the first voltage, and at a low level when the input voltage is equal to the second voltage or the reference voltage. The comparator 151 then transmits the first input signal 731 to the diagnoser 612 and the generator 613.

The comparator 152 of the input circuit 650 compares voltages in order to determine whether the input voltage is equal to the reference voltage. In detail, the comparator 152 compares the input voltage with a second threshold voltage Vt2 lower than the second voltage and higher than the reference voltage, and outputs the second input signal 732 at a high level when the input voltage is higher than the second threshold voltage Vt2, and outputs the second input signal 732 at a low level when the input voltage is lower than the second threshold voltage Vt2. The second threshold voltage is 6 V, for example, and is obtained by dividing the power supply voltage. The second input signal 732 is at a low level when the input voltage is equal to the second voltage, and at a high level when the input voltage is equal to the first voltage or the reference voltage. The comparator 152 then transmits the second input signal 732 to the generator 613.

The generator 613 outputs the OR of the first input signal 731 and the second input signal 732, in the form of the state signal 74. FIG. 23 illustrates a relationship between the levels of the two input signals 73 and the value of the state signal 74. In detail, when the input voltage Vi is higher than the first threshold voltage Vt1, the two input signals 73 are both at a high level, resulting in the state signal 74 having a value of "1". When the input voltage Vi is higher than the second threshold voltage Vt2 and lower than the first threshold voltage Vt1, the first input signal 731 is at a low level and the second input signal 732 is at a high level, resulting in the state signal 74 having a value of "1". When the input voltage Vi is lower than the second threshold voltage Vt2, the two input signals 73 are both at a low level, resulting in the state signal 74 having a value of "0". In summary, the generator 613 generates the state signal 74 indicating the closed state of the switch 20 when the second input signal 732 indicates that the input voltage is higher than the second threshold voltage, and generates the state signal 74 indicating the open state of the switch 20 when the second input signal 732 indicates that the input voltage is lower than the second threshold voltage. In other words, when the input voltage is equal to either one of the first voltage and the second voltage, that is, when the switch 20 is in the closed state, the state signal 74 has a value of "1" indicating the closed state of the switch 20. In contrast, when the input voltage is equal to the reference voltage, that is, when the switch 20 is in the open state, the state signal 74 has a value of "0" indicating the open state of the switch 20.

Figure 24:
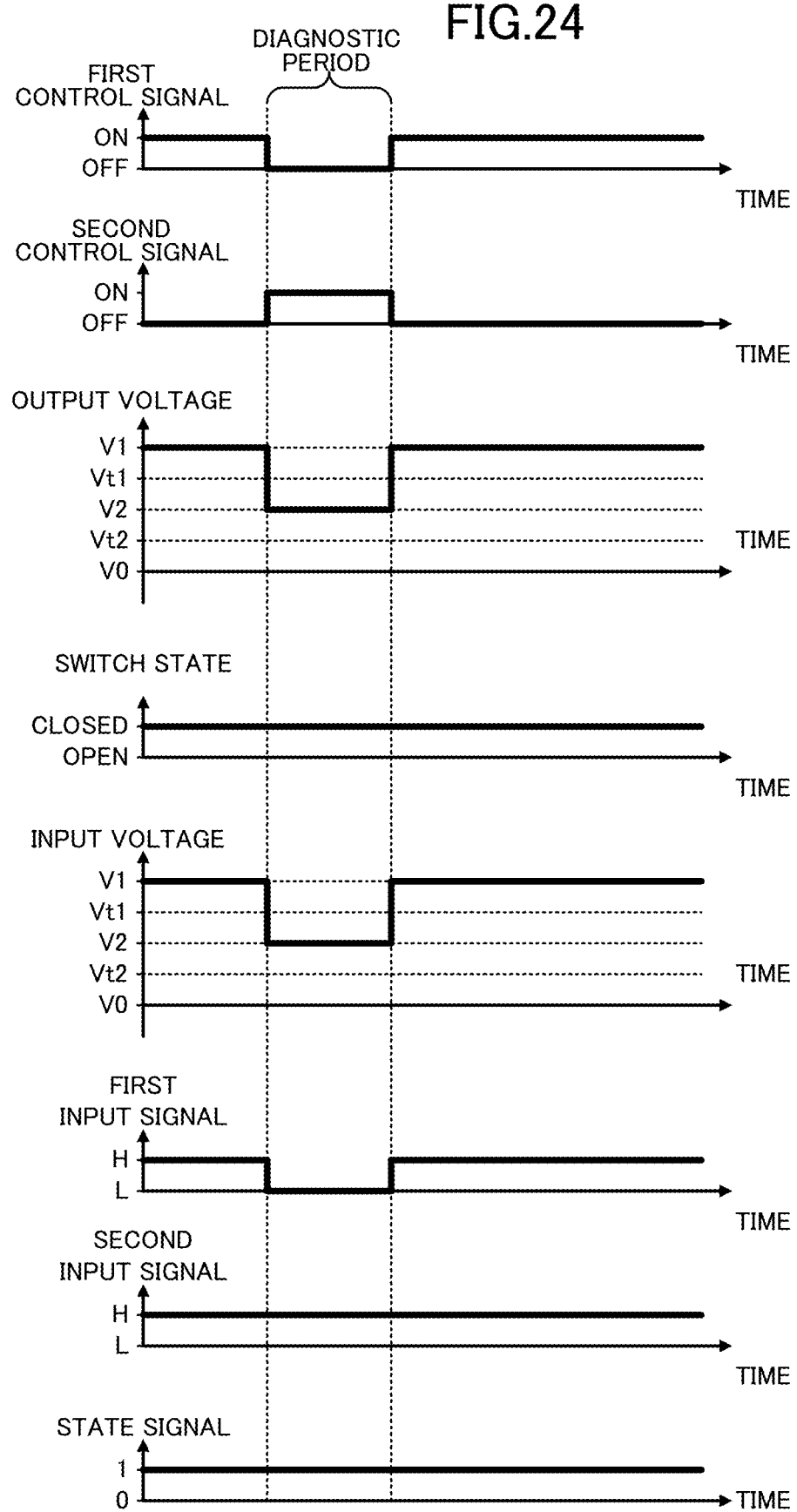
FIG. 24 illustrates transition of signals in the case where diagnosis is performed according to Embodiment 2.

FIG. 24 is a timing chart illustrating transition of signals in the case where diagnosis is performed in the input device 60. As illustrated in FIG. 24, during a normal period in the input device 60, the first control signal 711 is in the on state and the second control signal 712 is in the off state. During a diagnostic period, the first control signal 711 is in the off state and the second control signal 712 is in the on state. The output voltage is therefore equal to the first voltage V1 during the normal period, and equal to the second voltage V2 during the diagnostic period.

When the switch 20 maintains the closed state without being switched, the input voltage shifts like the output voltage. As is apparent from FIG. 23, the two input signals 73 are both at a high level during the normal period in which the input voltage is higher than the first threshold voltage Vt1. In contrast, the second input signal 732 remains at a high level and the first input signal 731 is at a low level during the diagnostic period. The value of the state signal 74 does not shift from "1" and thus corresponds to the state of the switch 20.

Figure 25:
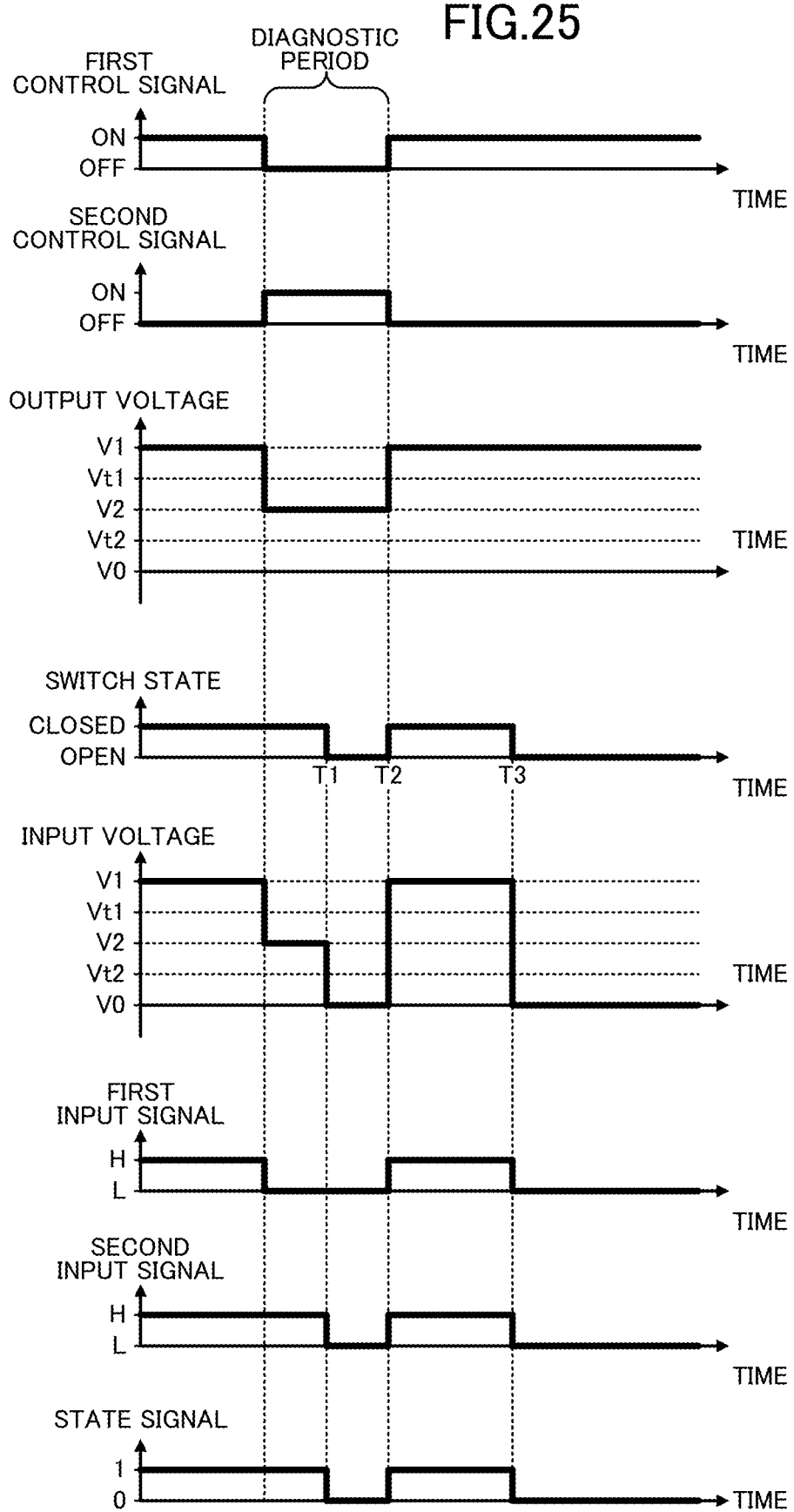
FIG. 25 illustrates transition of signals before and after switching of the state of a switch according to Embodiment 2.

FIG. 25 is a timing chart illustrating transition of signals before and after manipulation of the switch 20. As illustrated in FIG. 25, the switch 20 is in the open state from the time T1 until the time T2 within a diagnostic period, is temporarily turned into the closed state, and is then turned into the open state again at the time T3. While the switch 20 is in the open state, the input voltage is equal to the reference voltage, and the two input signals 73 are both at a low level, resulting in the state signal 74 having a value of "0". As is apparent from FIGS. 24 and 25, the state signal 74 shifts in accordance with the state of the switch 20.

As described above, the input device 60 according to the embodiment can improve the input responsiveness in parallel to execution of self-diagnosis, as in Embodiment 1.

The second voltage is lower than the first voltage, and the input circuit 650 receives the reference voltage lower than the second voltage while the switch is in the open state. Since the second voltage can be readily obtained by dividing the power supply voltage without a complicated circuit configuration, the input device can be achieved by a simple circuit configuration.

The above-described embodiments of the present disclosure are not intended to limit the scope of the present disclosure.

For example, although the input device 10 or 60 corresponds to an input unit of the PLC 100 in the above-described examples, this configuration is a mere example. The input device 10 or 60 may be an integrated control device capable of acquiring signals from the switch 20.

Although the output circuit 120 or 620 outputs either one of the first voltage and the second voltage in the above-described examples, this configuration is a mere example. The output circuit 120 or 620 may further output the reference voltage under instructions from the processor 110 or 610. Alternatively, the output circuit 120 or 620 may output a voltage selected from three or more types of voltages other than the reference voltage. In addition, the first voltage, the second voltage, and the reference voltage input to the input circuit 150 while the switch 20 is in the open state, are only required to have mutually different voltage values and may have any other voltage value.

The input signals contain two signals each indicating a 1-bit value in the above-described examples, this configuration is a mere example. The input signal is only required to identify the input voltage equal to the first voltage, the input voltage equal to the second voltage, and the input voltage equal to the reference voltage in the case of the switch in the open state. For example, the input signal may be at a high level when the input voltage is equal to the first voltage, at a low level when the input voltage is equal to the second voltage, and alternately switched between the high and low levels when the input voltage is equal to the reference voltage.

Figure 26:
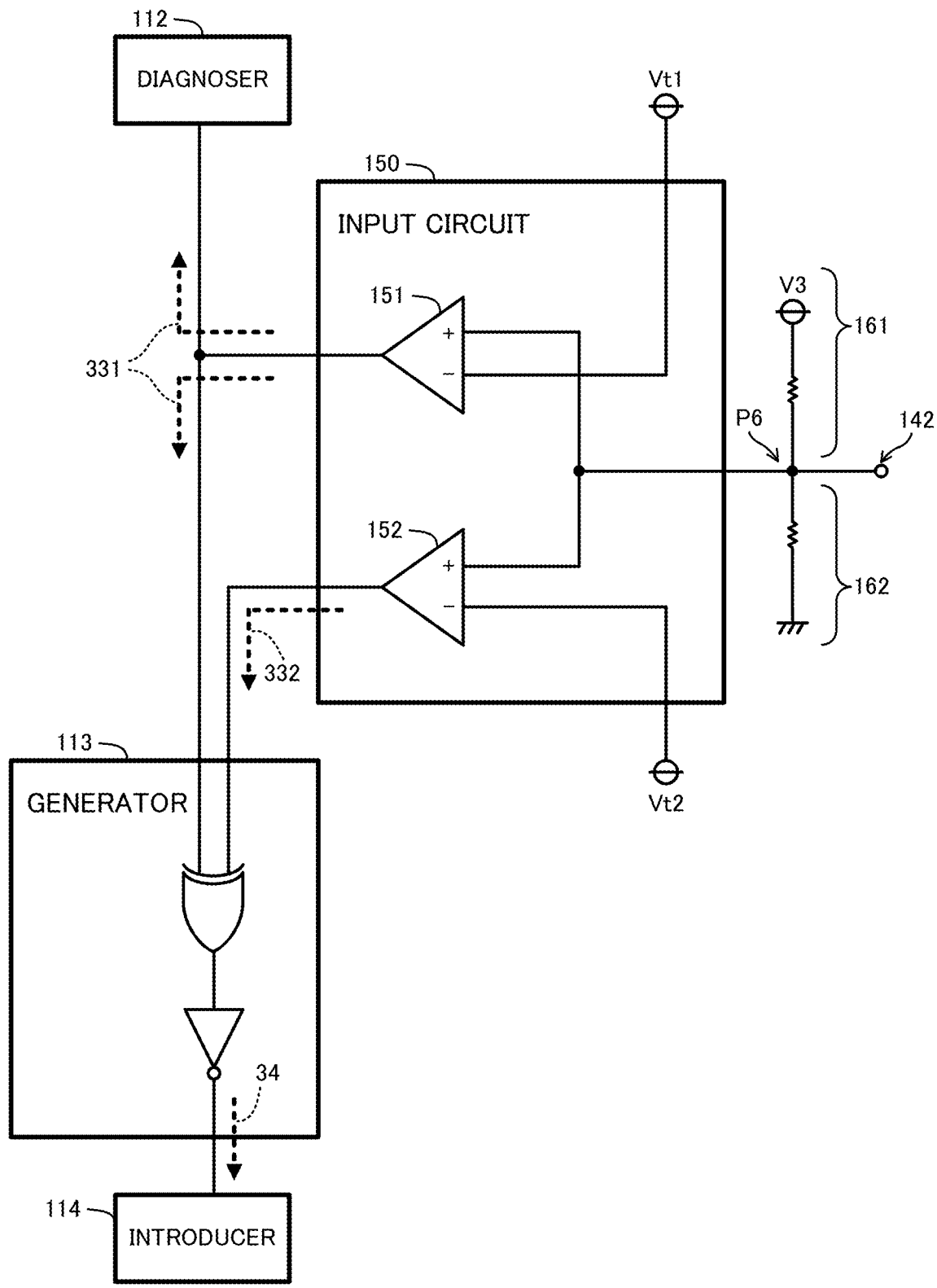
FIG. 26 is a diagram for describing a reference voltage according to a modification.

Although the reference voltage input to the input circuit 150 is equal to the ground electric potential while the switch 20 is in the open state in the above-described embodiments, this configuration is a mere example. For example, as illustrated in FIG. 26, the connecting point P6 may be connected to the power supply via a resistor and connected to the ground via another resistor. In the example illustrated in FIG. 26, the reference voltage divided at the two resistors is input to the input circuit 150 while the switch 20 is in the open state.

The input device 10 or 60 may exclude either one of circuit portions 161 and 162 illustrated in FIG. 26. The configuration without the circuit portion 161 is identical to the configuration according to Embodiment 1. In the configuration without the circuit portion 162, the reference voltage is equal to a power supply voltage V3. The reference voltage is only required to differ from the first voltage and the second voltage output from the output circuit 120 and may have any other level.

Although the input device 10 or 60 includes the output circuit 120 in the above-described embodiments, this configuration is a mere example. The output circuit 120 may also be disposed outside the input device 10 or 60. In the case where the output circuit 120 is disposed outside, the input device 10 or 60 is connected to the output circuit 120 serving as a power supply to output the first and second voltages, via the switch 20. In this case, the diagnoser 112 may acquire the period signal 32 from the external output circuit 120. Alternatively, the diagnoser 112 may execute diagnosis in a diagnostic period of which the timing is predetermined in common with the external output circuit 120, without acquiring the period signal 32. Alternatively, the output circuit 120 may alternately output the first and second voltages in a predetermined cycle, and the diagnoser 112 may execute diagnosis in accordance with this cycle. For example, the output circuit 120 may switch the output voltage between the first voltage and the second voltage every one second, and the diagnoser 112 may determine whether any change has occurred in the input signals during the previous one second, at any timing.

Although the single processor 110 or 610 has a plurality of functions in the above-described embodiments, this configuration is a mere example. For example, the output controller 111, the diagnoser 112, the generator 113, and the introducer 114 included in the input device 10 may be achieved by separate pieces of hardware.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of International Patent Application No. PCT/JP2019/028810, filed on Jul. 23, 2019, the entire disclosure of which is incorporated by reference herein.

INDUSTRIAL APPLICABILITY

The present disclosure is suitable for self-diagnosis of a device that acquires input from the outside.

REFERENCE SIGNS LIST

10, 60 Input device
112, 612 Diagnoser
113, 613 Generator
120, 620 Output circuit
150, 650 Input circuit
161, 162 Circuit portion
20 Switch
33, 73 Input signal
331, 731 First input signal
332, 732 Second input signal
34, 74 State signal

The invention claimed is:

1. An input device connectable to a switch to receive a state of the switch, the state being input in form of a voltage corresponding to the state, the input device comprising:
   an output circuit to output a voltage selected from a first voltage and a second voltage different from the first voltage;
   an input circuit to receive the voltage output from the output circuit via the switch in a closed state and output an input signal corresponding to the input voltage;
   processing circuitry configured as a diagnoser to determine whether any change occurs in the input signal in response to switching of the voltage output from the output circuit to the second voltage; and
   the processing circuitry is further configured as a generator to generate a state signal indicating the state of the switch on basis of the input signal, wherein
   the second voltage is lower than a reference voltage input to the input circuit while the switch is in an open state,
   the input circuit receives the reference voltage while the switch is in the open state, the reference voltage being lower than the first voltage,
   the input circuit outputs a first input signal and a second input signal as the input signal, the first input signal indicating whether the input voltage is higher than a first threshold voltage that is lower than the first voltage and higher than the reference voltage, the second input signal indicating whether the input voltage is higher than a second threshold voltage that is lower than the reference voltage and higher than the second voltage,
   the diagnoser determines whether any change occurs in the first input signal, and
   the generator
      generates the state signal indicating that the switch is in the closed state when the first input signal indicates that the input voltage is higher than the first threshold voltage or when the second input signal indicates that the input voltage is lower than the second threshold voltage, and
      generates the state signal indicating that the switch is in the open state when the first input signal indicates that the input voltage is lower than the first threshold voltage while the second input signal indicates that the input voltage is higher than the second threshold voltage.

2. An input diagnosing method executable by an input device that receives a state of a switch, the state being input in form of a voltage corresponding to the state, the input diagnosing method comprising:
   outputting, by an inputter of the input device, an input signal that is based on an input voltage input via the switch in a closed state, the input voltage being selected from a first voltage and a second voltage different from the first voltage and being output from an outputter of the input device to the switch;
   determining, by a diagnoser of the input device, whether any change occurs in the input signal in response to switching of the voltage that is output from the outputter to the second voltage; and
   generating, by a generator of the input device, a state signal indicating the state of the switch on basis of the input signal, wherein
   the second voltage is lower than a reference voltage input to the inputter while the switch is in an open state,
   the inputter receives the reference voltage while the switch is in the open state, the reference voltage being lower than the first voltage, the inputter outputs a first input signal and a second input signal as the input signal, the first input signal indicating whether the input voltage is higher than a first threshold voltage that is lower than the first voltage and higher than the reference voltage, the second input signal indicating whether the input voltage is higher than a second threshold voltage that is lower than the reference voltage and higher than the second voltage, the diagnoser determines whether any change occurs in the first input signal, and the generator generates the state signal indicating that the switch is in the closed state when the first input signal indicates that the input voltage is higher than the first threshold voltage or when the second input signal indicates that the input voltage is lower than the second threshold voltage, and generates the state signal indicating that the switch is in the open state when the first input signal indicates that the input voltage is lower than the first threshold voltage while the second input signal indicates that the input voltage is higher than the second threshold voltage.

\* \* \* \* \*